US012568757B2

(12) United States Patent
Lee et al.

(10) Patent No.: US 12,568,757 B2
(45) Date of Patent: Mar. 3, 2026

---

(54) DISPLAY DEVICE

(71) Applicant: LG DISPLAY CO., LTD., Seoul (KR)

(72) Inventors: Chanwoo Lee, Paju-si (KR); JungIl Lee, Goyang-si (KR); MyeongHak Hyun, Goyang-si (KR)

(73) Assignee: LG Display Co., Ltd (KR)

( * ) Notice: Subject to any disclaimer, the term of this patent is extended or adjusted under 35 U.S.C. 154(b) by 654 days.

(21) Appl. No.: 17/886,997

(22) Filed: Aug. 12, 2022

(65) Prior Publication Data

US 2023/0074967 A1      Mar. 9, 2023

(30) Foreign Application Priority Data

Sep. 3, 2021      (KR) ........................ 10-2021-0117609

(51) Int. Cl.
*H10K 77/10*          (2023.01)
*B32B 3/30*          (2006.01)
(Continued)

(52) U.S. Cl.
CPC .............. *H10K 77/111* (2023.02); *B32B 3/30* (2013.01); *H10K 59/1213* (2023.02);
(Continued)

(58) Field of Classification Search
CPC ............. H10K 77/111; H10K 59/1213; H10K 59/126; H10K 2102/311; H10K 50/86; B32B 3/30; B32B 9/041; B32B 15/20; B32B 2307/412; B32B 2307/42; B32B 2307/7244; B32B 2307/7246; B32B 2457/20; B32B 15/043; B32B 2255/20; B32B 2307/40; G09G 3/3233; G09G 2300/0842; G09G 2300/0426;
(Continued)

(56) References Cited

U.S. PATENT DOCUMENTS

2019/0041915 A1*    2/2019  Park ........................ H10D 86/60
2020/0212144 A1*    7/2020  Ahn ........................ H10K 50/15
2023/0023671 A1*    1/2023  Shim ...................... H10K 59/38

FOREIGN PATENT DOCUMENTS

KR          10-1296263 B1      8/2013
KR     10-2016-0084549 A      7/2016
(Continued)

OTHER PUBLICATIONS

Office Action in Korean Appln. No. 10-2021-0117609, mailed on Jul. 1, 2025, 11 pages (with English translation).
(Continued)

*Primary Examiner* — Evan G Clinton
(74) *Attorney, Agent, or Firm* — Fish & Richardson P.C.

(57)          ABSTRACT

A display device includes a substrate which includes an active area including a plurality of sub pixels and a non-active area, and is formed of one of transparent conductive oxide or an oxide semiconductor layer, an insulating layer on the substrate, a plurality of thin film transistors which is on the insulating layer and includes an active layer having a channel region, a gate electrode, a source electrode, and a drain electrode and a plurality of light emitting diodes disposed in the plurality of sub pixels on the insulating layer, wherein the substrate includes a plurality of holes which overlap with at least a part of the active layer.

19 Claims, 15 Drawing Sheets

(51) Int. Cl.

| | |
|---|---|
| *H10K 59/121* | (2023.01) |
| *H10K 59/126* | (2023.01) |
| *B32B 9/04* | (2006.01) |
| *B32B 15/20* | (2006.01) |
| *G09G 3/3233* | (2016.01) |
| *H10K 102/00* | (2023.01) |

(52) U.S. Cl.
CPC ............ *H10K 59/126* (2023.02); *B32B 9/041* (2013.01); *B32B 15/20* (2013.01); *B32B 2307/412* (2013.01); *B32B 2307/42* (2013.01); *B32B 2307/7244* (2013.01); *B32B 2307/7246* (2013.01); *B32B 2457/20* (2013.01); *G09G 3/3233* (2013.01); *G09G 2300/0842* (2013.01); *H10K 2102/311* (2023.02)

(58) Field of Classification Search
CPC ......... G09G 2320/0295; H10D 86/411; H10D 86/481; H10D 86/60; H10D 89/60
See application file for complete search history.

(56) References Cited

FOREIGN PATENT DOCUMENTS

| | | | | |
|---|---|---|---|---|
| KR | 20180070185 | A | * | 6/2018 |
| KR | 20190016171 | A | | 2/2019 |
| KR | 10-2019-0028594 | A | | 3/2019 |

OTHER PUBLICATIONS

Notice of Allowance in Korean Appln. No. 10-2021-0117609, mailed on Oct. 15, 2025, 5 pages (with English translation).

* cited by examiner

100

140
130
120
IN
110
150

DISPLAY DEVICE

CROSS-REFERENCE TO RELATED APPLICATION

This application claims the priority of Korean Patent Application No. 10-2021-0117609 filed on Sep. 3, 2021, which is hereby incorporated by reference in its entirety.

BACKGROUND

Field of the Disclosure

The present disclosure relates to a display device, and more particularly, to a display device which does not use a plastic substrate to improve a moisture permeation characteristic and reduce a parasitic capacitance.

Description of the Background

As display devices which are used for a monitor of a computer, a television, or a cellular phone, there are an organic light emitting display (OLED) device which is a self-emitting device and a liquid crystal display (LCD) device which requires a separate light source.

An applicable range of the display device is diversified to personal digital assistants as well as monitors of computers and televisions and a display device with a large display area and a reduced volume and weight is being studied.

Further, recently, a flexible display device which is manufactured by forming a display element and a wiring line on a flexible substrate such as plastic which is a flexible material so as to be capable of displaying images even though the display device is folded or rolled is getting attention as a next generation display device.

SUMMARY

Accordingly, the present disclosure is to provide a display device which uses one of a transparent conductive oxide layer and an oxide semiconductor layer as a substrate, instead of a plastic substrate.

The present disclosure is also to provide a display device which minimizes permeation of moisture and oxide.

The present disclosure is also to provide a display device which removes a plastic substrate to simplify a process and reduce a manufacturing cost.

The present disclosure is also to provide a display device which minimizes a parasitic capacitance by a substrate formed of one of a transparent conductive oxide layer and an oxide semiconductor layer to improve a reliability of a thin film transistor.

The present disclosure is also to provide a display device in which an oxide semiconductor cover layer or a plurality of oxide semiconductors which fills a plurality of holes disposed in the substrate is disposed to smoothly separate a substrate and a temporary substrate during a laser lift off (LLO) process.

The present disclosure is not limited to the above-mentioned, which are not mentioned above, can be clearly understood by those skilled in the art from the following descriptions.

According to an aspect of the present disclosure, a display device includes a substrate which includes an active area including a plurality of sub pixels and a non-active area, and is formed of one of transparent conductive oxide or an oxide semiconductor layer, an insulating layer on the substrate, a plurality of thin film transistors which is on the insulating layer and includes an active layer having a channel region, a gate electrode, a source electrode, and a drain electrode and a plurality of light emitting diodes disposed in the plurality of sub pixels on the insulating layer, wherein the substrate includes a plurality of holes which overlaps with at least a part of the active layer.

According to another aspect of the present disclosure, a display device includes a substrate including an active area and a non-active area at the outside of the active area, a plurality of thin film transistors including an active layer having a source region, a drain region, and a channel region on the substrate and an insulating layer disposed between the plurality of thin film transistors and the substrate, wherein the substrate is formed of one of a transparent conductive oxide or an oxide semiconductor including a plurality of holes overlapping with at least a part of the active layer.

Other detailed matters of the exemplary aspects are included in the detailed description and the drawings.

According to the present disclosure, a transparent conductive oxide layer and an oxide semiconductor layer are used as a substrate of the display device to easily control a moisture permeability.

According to the present disclosure, a thin transparent conductive oxide layer and a thin oxide semiconductor layer are used as substrates of the display device to improve a flexibility of the display device.

According to the present disclosure, a thin transparent conductive oxide layer and a thin oxide semiconductor layer are used as substrates of a display device to relieve a stress generated when the display device is bent or rolled and reduce a crack of the display device.

According to the present disclosure, a transparent conductive oxide layer and an oxide semiconductor layer are used as substrates of the display device to simplify a structure of the display device and reduce a manufacturing cost.

According to the present disclosure, a transparent conductive oxide layer and an oxide semiconductor layer are used as substrates of the display device to reduce the generation of static electricity and improve a display quality.

According to the present disclosure, the substrate of the display device is manufactured by a deposition process in a vacuum environment so that a substrate manufacturing time may be shortened, and foreign materials formed on the substrate and a defect thereby may be minimized.

According to the present disclosure, a plurality of holes is disposed on a substrate of the display device formed of a transparent conductive oxide layer or an oxide semiconductor layer to minimize a parasitic capacitance between the substrate and the thin film transistor.

According to the present disclosure, a transparent conductive oxide layer or an oxide semiconductor layer in which a plurality of holes is disposed is used as a substrate of the display device to minimize degradation of mobility of electrons or holes of a channel region.

According to the present disclosure, an oxide semiconductor cover layer or a plurality of oxide semiconductors which fills a plurality of holes of the substrate is disposed to completely separate the substrate and the temporary substrate during the LLO process to minimize the defect of the display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
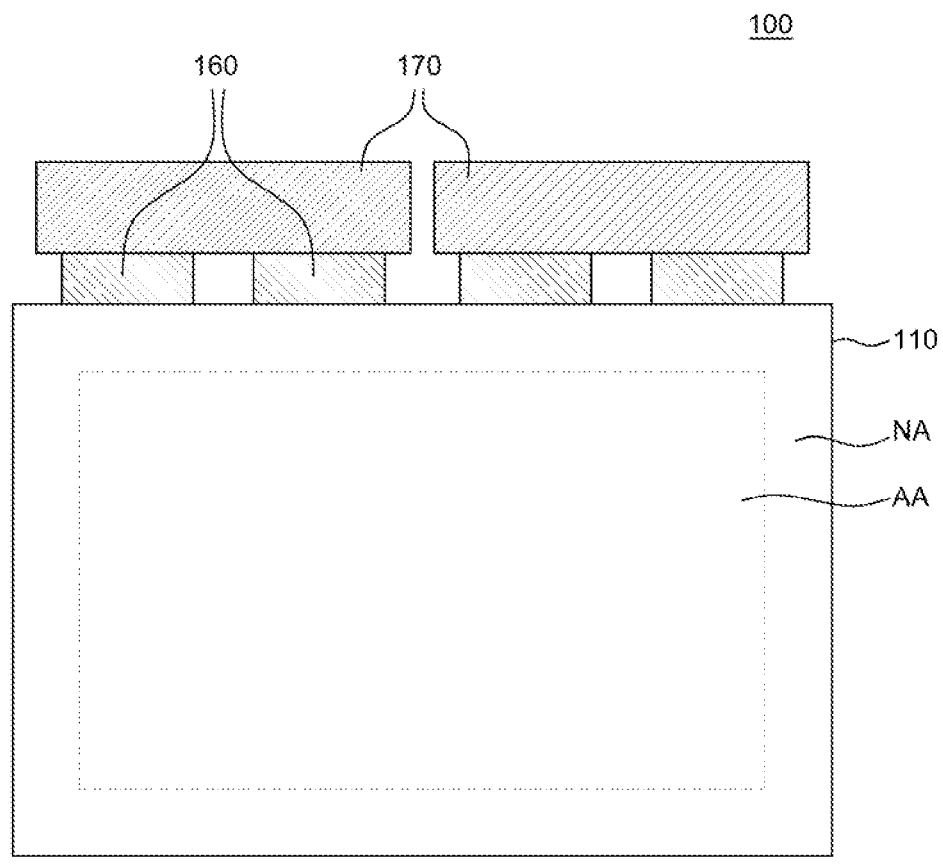
FIG. 1 is a plan view of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

Figure 2:
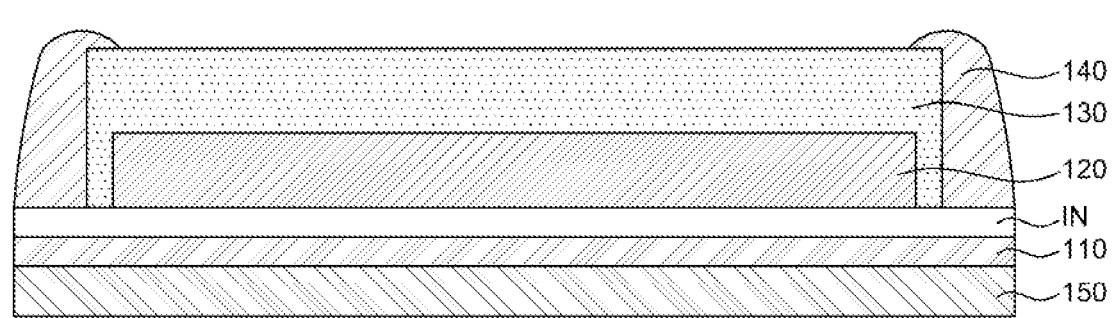
FIG. 2 is a schematic cross-sectional view of a display device according to an exemplary aspect of the present disclosure.

FIG. 1 is a plan view of a display device according to an exemplary aspect of the present disclosure. FIG. 2 is a schematic cross-sectional view of a display device according to an exemplary aspect of the present disclosure. For the convenience of description, in FIG. 1, among various components of the display device 100, only a substrate 110, a plurality of flexible films 160, and a plurality of printed circuit boards 170 are illustrated.

Referring to FIGS. 1 and 2, the substrate 110 is a support member which supports other components of the display device 100. The substrate 110 may be formed of any one of a transparent conductive oxide or an oxide semiconductor. For example, the substrate 110 may be formed of a transparent conductive oxide (TCO), such as indium tin oxide (ITO), indium zinc oxide (IZO), and indium tin zinc oxide (ITZO).

Further, the substrate 110 may be formed of an oxide semiconductor material formed of indium (In) and gallium (Ga), for example, a transparent oxide semiconductor such as indium gallium zinc oxide (IGZO), indium gallium oxide (IGO), and indium tin zinc oxide (ITZO). However, a type of a material of a transparent conductive oxide and an oxide semiconductor is illustrative so that the substrate 110 may be formed by another transparent conductive oxide and oxide semiconductor material which have not been described in the specification, but is not limited thereto.

In the meantime, the substrate 110 may be formed by depositing a transparent conductive oxide or an oxide semiconductor with a very thin thickness. Therefore, as the substrate 110 is formed to have a very thin thickness, the substrate has a flexibility. A display device 100 including a substrate 110 having a flexibility may be implemented as a flexible display device 100 which displays an image even in a folded or rolled state. For example, when the display device 100 is a foldable display device, the substrate 110 is folded or unfolded with respect to a folding axis. As another example, when the display device 100 is a rollable display device, the display device may be stored by being rolled around the roller. Accordingly, the display device 100 according to an exemplary aspect of the present disclosure uses a substrate 110 having a flexibility to be implemented as a flexible display device 100 like a foldable display device or a rollable display device.

Further, the display device 100 according to an exemplary aspect of the present disclosure uses a substrate 110 formed of a transparent conductive oxide or an oxide semiconductor to perform a laser lift off (LLO) process. The LLO process refers to a process of separating a temporary substrate below the substrate 110 and the substrate 110 using laser during the manufacturing process of a display device 100. Accordingly, the substrate 110 is a layer for more easily performing the LLO process so that it is referred to as a functional thin film, a functional thin film layer, or a functional substrate. The LLO process will be described in more detail below.

The substrate 110 may include a plurality of holes. In FIG. 1, for the convenience of description, the plurality of holes is not illustrated. The plurality of holes will be described in more detail with reference to FIGS. 4A to 5.

The substrate 110 includes an active area AA and a non-active area NA.

The active area AA is an area where images are displayed. In the active area AA, a pixel unit 120 configured by a plurality of sub pixels may be disposed to display images. For example, the pixel unit 120 is configured by a plurality of sub pixels including a light emitting diode and a driving circuit to display images.

The non-active area NA is an area where no image is displayed and various wiring lines and driving ICs for driving the sub pixels disposed in the active area AA are disposed. For example, in the non-active area NA, various driving ICs such as a gate driver IC and a data driver IC may be disposed.

The plurality of flexible films 160 is disposed at one end of the substrate 110. The plurality of flexible films 160 is electrically connected to one end of the substrate 110. The plurality of flexible films 160 is films in which various components are disposed on a base film having malleability to supply a signal to the plurality of sub pixels of the active area AA. One ends of the plurality of flexible films 160 are disposed in the non-active area NA of the substrate 110 to supply a data voltage to the plurality of sub pixels of the active area AA. In the meantime, even though four flexible films 160 are illustrated in FIG. 1, the number of flexible films 160 may vary depending on the design, but is not limited thereto.

In the meantime, a driving IC such as a gate driver IC or a data driver IC may be disposed on the plurality of flexible films 160. The driving IC is a component which processes data for displaying images and a driving signal for processing the data. The driving IC may be disposed by a chip on glass (COG), a chip on film (COF), or a tape carrier package (TCP) technique depending on a mounting method. In the present specification, for the convenience of description, it is described that the driving IC is mounted on the plurality of flexible films 160 by a chip on film technique, but is not limited thereto.

The printed circuit board 170 is connected to the plurality of flexible films 160. The printed circuit board 170 is a component which supplies signals to the driving IC. Various components may be disposed in the printed circuit board 170 to supply various driving signals such as a driving signal or a data voltage to the driving IC. In the meantime, even though two printed circuit boards 170 are illustrated in FIG. 1, the number of printed circuit boards 170 may vary depending on the design and is not limited thereto.

Referring to FIG. 2, an insulating layer IN is disposed on the substrate 110. The insulating layer IN suppresses moisture and/or oxygen which penetrates from the outside of the substrate 110 from being spread. The moisture permeation characteristic of the display device 100 may be controlled by controlling a thickness or a lamination structure of the insulating layer IN. Further, the insulating layer IN may suppress a short problem caused when the substrate 110 formed of a transparent conductive oxide or an oxide semiconductor is in contact with the other configurations such as a pixel unit 120. The insulating layer IN may be formed of an inorganic material, for example, may be configured by a single layer or a double layer of silicon oxide (SiOx) and silicon nitride (SiNx), but is not limited thereto.

A pixel unit 120 is disposed on the insulating layer IN. The pixel unit 120 may be disposed so as to correspond to the active area AA. The pixel unit 120 is a component which includes a plurality of sub pixels to display images. The plurality of sub pixels of the pixel unit 120 is minimum units which configure the active area AA and a light emitting diode and a driving circuit may be disposed in each of the plurality of sub pixels. For example, the light emitting diode of each of the plurality of sub pixels may include an organic light emitting diode including an anode, an organic emission layer, and a cathode or an LED including an N-type and a P-type semiconductor layers and an emission layer, but is not limited thereto. The driving circuit for driving the plurality of sub pixels may include a driving element such as a thin film transistor or a storage capacitor, but is not limited thereto. Hereinafter, for the convenience of description, it is assumed that the light emitting diode of each of the plurality of sub pixels is an organic light emitting diode, but it is not limited thereto.

In the meantime, the display device 100 may be configured by a top emission type or a bottom emission type, depending on an emission direction of light which is emitted from the light emitting diode.

According to the top emission type, light emitted from the light emitting diode is emitted to an upper portion of the substrate 110 on which the light emitting diode is disposed. In the case of the top emission type, a reflective layer may be formed below the anode to allow the light emitted from the light emitting diode to travel to the upper portion of the substrate 110, that is, toward the cathode.

According to the bottom emission type, light emitted from the light emitting diode is emitted to a lower portion of the substrate 110 on which the light emitting diode is disposed. In the case of the bottom emission type, the anode may be formed only of a transparent conductive material and the cathode may be formed of the metal material having a high reflectance to allow the light emitted from the light emitting diode to travel to the lower portion of the substrate 110.

Hereinafter, for the convenience of description, the description will be made by assuming that the display device 100 according to an exemplary aspect of the present disclosure is a bottom emission type display device, but it is not limited thereto.

An encapsulation layer 130 is disposed to cover the pixel unit 120. The encapsulation layer 130 seals the pixel unit 120 to protect the light emitting diode of the pixel unit 120 from moisture, oxygen, and impacts of the outside. The encapsulation layer 130 may be formed by alternately laminating a plurality of inorganic layers and a plurality of organic layers. For example, the inorganic layer may be formed of an inorganic material such as silicon nitride (SiNx), silicon oxide (SiOx), and aluminum oxide (AlOx) and the organic layer may be formed of epoxy or acrylic polymer, but they are not limited thereto. Further, the encapsulation layer 130 may be configured by a face seal type. For example, the encapsulation layer 130 may be formed by forming ultraviolet or thermosetting sealant on the entire surface of the pixel unit 120. However, the structure of the encapsulation layer 130 may be formed by various methods and materials, but is not limited thereto.

In the meantime, an encapsulation substrate which has a high modulus and is formed of a metal material having a high corrosion resistance may be further disposed on the encapsulation layer 130. For example, the encapsulation substrate may be formed of a material having a high modulus of approximately 200 to 900 MPa. Alternatively, the encapsulation substrate may be formed of a metal material, which has a high corrosion resistance and is easily processed in the form of a foil or a thin film, such as aluminum (Al), nickel (Ni), chromium (Cr), iron (Fe), and an alloy material of nickel. Therefore, as the encapsulation substrate is formed of a metal material, the encapsulation substrate may be implemented as an ultra-thin film and provide a strong resistance against external impacts and scratches.

A seal member 140 is disposed so as to enclose side surfaces of the pixel unit 120 and the encapsulation layer 130. The seal member 140 is disposed in the non-active area NA and is disposed to enclose the pixel unit 120 disposed in the active area AA. The seal member 140 is disposed so as to enclose a side surface of the pixel unit 120 and a side surface of the encapsulation layer 130 to minimize the moisture permeation to the pixel unit 120. For example, the seal member 140 may be disposed so as to cover an upper surface of an insulating layer IN overlapping with a non-active area NA protruding to the outside of the pixel unit 120, a side surface of the encapsulation layer 130 disposed to enclose the pixel unit 120, and a part of an upper surface of the encapsulation layer 130.

The seal member 140 may be formed of a non-conductive material having an elasticity so as to encapsulate the side surface of the pixel unit 120 and reinforce the rigidity of the side surface of the display device 100. Further, the seal member 140 may be formed of a material having an adhesiveness. The seal member 140 may further include an absorbent which absorbs moisture and oxygen from the outside to minimize the moisture permeation through the side portion of the display device 100. For example, the seal member 140 may be formed of polyimide (PI), poly urethane, epoxy, or acryl based material, but is not limited thereto.

A polarizer 150 is disposed below the substrate 110. The polarizer 150 selectively transmits light to reduce the reflection of external light which is incident onto the substrate 110. Specifically, in the display device 100, various metal materials which are applied to semiconductor devices, wiring lines, and light emitting diodes is formed on the substrate 110. Therefore, the external light incident onto the substrate 110 may be reflected from the metal material so that the visibility of the display device 100 may be reduced due to the reflection of the external light. At this time, the polarizer 150 which suppresses the reflection of external light is disposed below the substrate 110 to increase outdoor visibility of the display device 100. However, the polarizer 150 may be omitted depending on an implementation example of the display device 100.

Even though not illustrated in the drawing, a barrier film may be disposed below the substrate 110 together with the polarizer 150. The barrier film minimizes the permeation of the moisture and oxygen from the outside of the substrate 110 into the substrate 110 to protect the pixel unit 120 including a light emitting diode. However, the barrier film may be omitted depending on an implementation example of the display device 100, but it is not limited thereto.

Hereinafter, the plurality of sub pixels of the pixel unit 120 will be described in more detail with reference to FIGS. 3 to 5.

Figure 3:
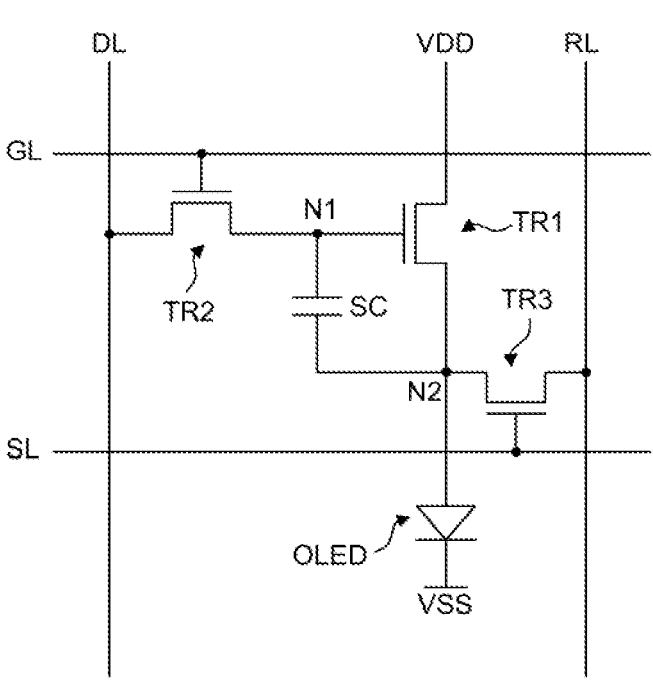
FIG. 3 is a circuit diagram of a sub pixel of a display device according to an exemplary aspect of the present disclosure.

FIG. 3 is a circuit diagram of a sub pixel of a display device according to an exemplary aspect of the present disclosure.

Referring to FIG. 3, the driving circuit for driving the light emitting diode OLED of the plurality of sub pixels SP includes a first transistor TR1, a second transistor TR2, a third transistor TR3, and a storage capacitor SC. In order to drive the driving circuit, a plurality of wiring lines including a gate line GL, a data line DL, a high potential power line VDD, a sensing line SL, and a reference line RL are disposed on the substrate 110.

Each of the first transistor TR1, the second transistor TR2, and the third transistor TR3 included in the driving circuit of one sub pixel SP includes a gate electrode, a source electrode, and a drain electrode.

The first transistor TR1, the second transistor TR2, and the third transistor TR3 may be P-type thin film transistors or N-type thin film transistors. For example, in the P-type thin film transistor, since holes flow from the source electrode to the drain electrode, the current flows from the source electrode to the drain electrode. In the N-type thin film transistor, since electrons flow from the source electrode to the drain electrode, the current flows from the drain electrode to the source electrode. Hereinafter, the description will be made under the assumption that the first transistor TR1, the second transistor TR2, and the third transistor TR3 are N-type thin film transistors in which the current flows from the drain electrode to the source electrode, but the present disclosure is not limited thereto.

The first transistor TR1 includes a first active layer, a first gate electrode, a first source electrode, and a first drain electrode. The first gate electrode is connected to a first node N1, the first source electrode is connected to the anode of the light emitting diode OLED, and the first drain electrode is connected to the high potential power line VDD. When a voltage of the first node N1 is higher than a threshold voltage, the first transistor TR1 is turned on and when the voltage of the first node N1 is lower than the threshold voltage, the first transistor TR1 is turned off. When the first transistor TR1 is turned on, a driving current may be transmitted to the light emitting diode OLED by means of the first transistor TR1. Therefore, the first transistor TR1 which controls the driving current transmitted to the light emitting diode OLED may be referred to as a driving transistor.

The second transistor TR2 includes a second active layer, a second gate electrode, a second source electrode, and a second drain electrode. The second gate electrode is connected to the gate line GL, the second source electrode is connected to the first node N1, and the second drain electrode is connected to the data line DL. The second transistor TR2 may be turned on or off based on a gate voltage from the gate line GL. When the second transistor TR2 is turned on, a data voltage from the data line DL may be charged in the first node N1. Therefore, the second transistor TR2 which is turned on or turned off by the gate line GL may also be referred to as a switching transistor.

The third transistor TR3 includes a third active layer, a third gate electrode, a third source electrode, and a third drain electrode. The third gate electrode is connected to the sensing line SL, the third source electrode is connected to the second node N2, and the third drain electrode is connected to the reference line RL. The third transistor TR3 may be turned on or off based on a sensing voltage from the sensing line SL. When the third transistor TR3 is turned on, a reference voltage from the reference line RL may be transmitted to the second node N2 and the storage capacitor SC. Therefore, the third transistor TR3 may also be referred to as a sensing transistor.

In the meantime, even though in FIG. 3, it is illustrated that the gate line GL and the sensing line SL are separate wiring lines, the gate line GL and the sensing line SL may be implemented as one wiring line, but it is not limited thereto.

The storage capacitor SC is connected between the first gate electrode and the first source electrode of the first transistor TR1. That is, the storage capacitor SC may be connected between the first node N1 and the second node N2. The storage capacitor SC maintains a potential difference between the first gate electrode and the first source electrode of the first transistor TR1 while the light emitting diode OLED emits light, so that a constant driving current may be supplied to the light emitting diode OLED. The storage capacitor SC includes a plurality of capacitor electrodes and for example, one of the plurality of capacitor electrodes is connected to the first node N1 and the other one is connected to the second node N2.

The light emitting diode OLED includes an anode, an emission layer, and a cathode. The anode of the light emitting diode OLED is connected to the second node N2 and the cathode is connected to the low potential power line VSS. The light emitting diode OLED is supplied with a driving current from the first transistor TR1 to emit light.

In the meantime, in FIG. 3, it is described that the driving circuit of the sub pixel SP of the display device 100 according to an exemplary aspect of the present disclosure has a 3T1C structure including three transistors and one storage capacitor SC. However, the number and a connection relationship of the transistors and the storage capacitor may vary in various ways depending on the design and are not limited thereto.

Figure 4A:
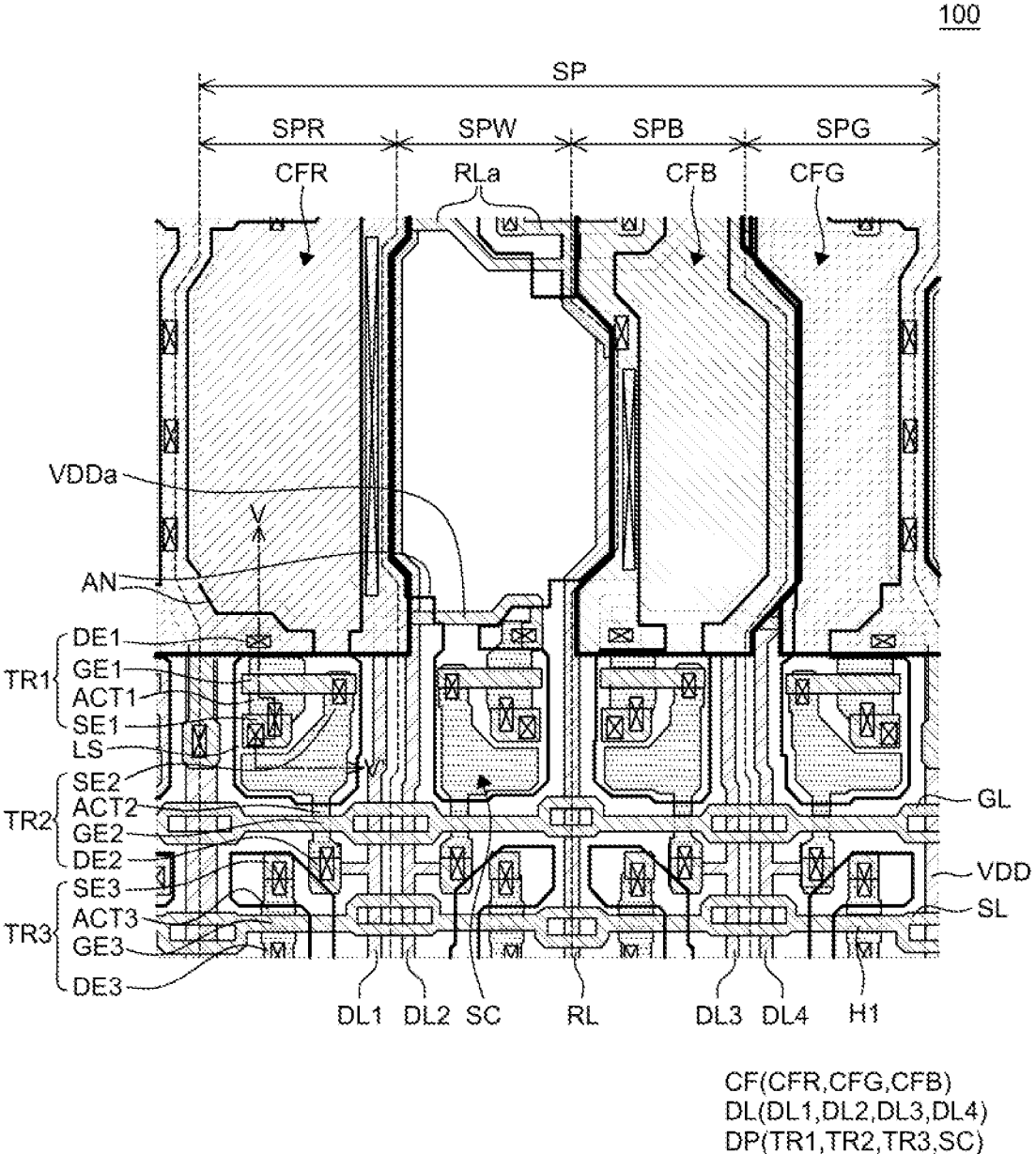
FIGS. 4A to 4C are enlarged plan views of a display device according to an exemplary aspect of the present disclosure.
Figure 4B:
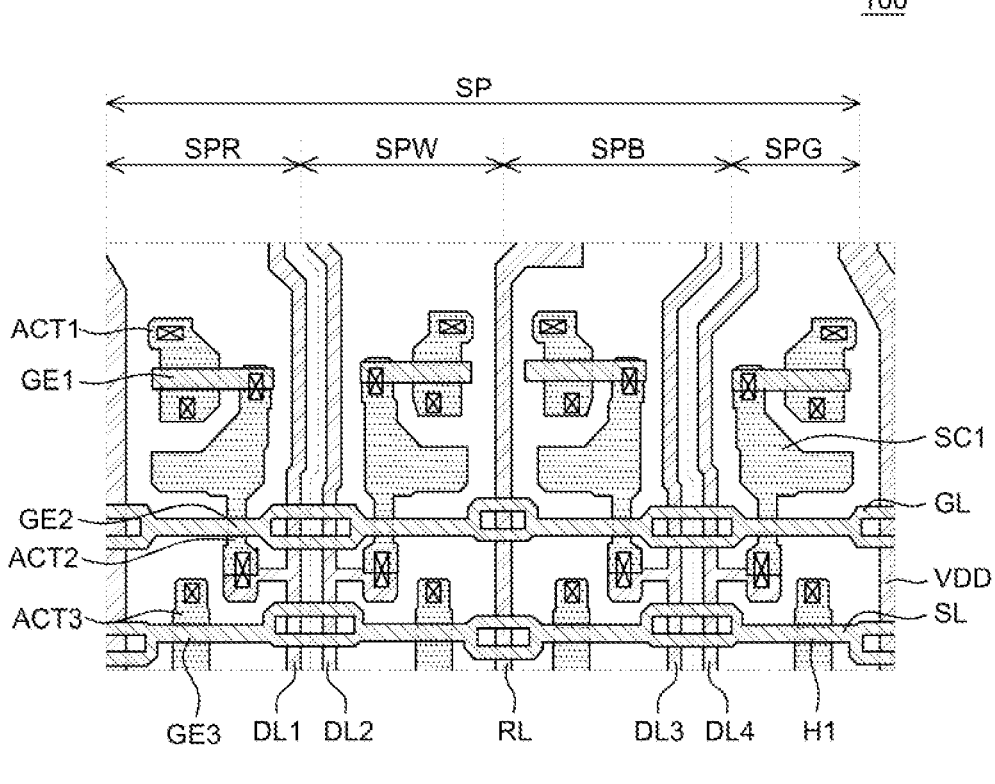
Figure 4C:
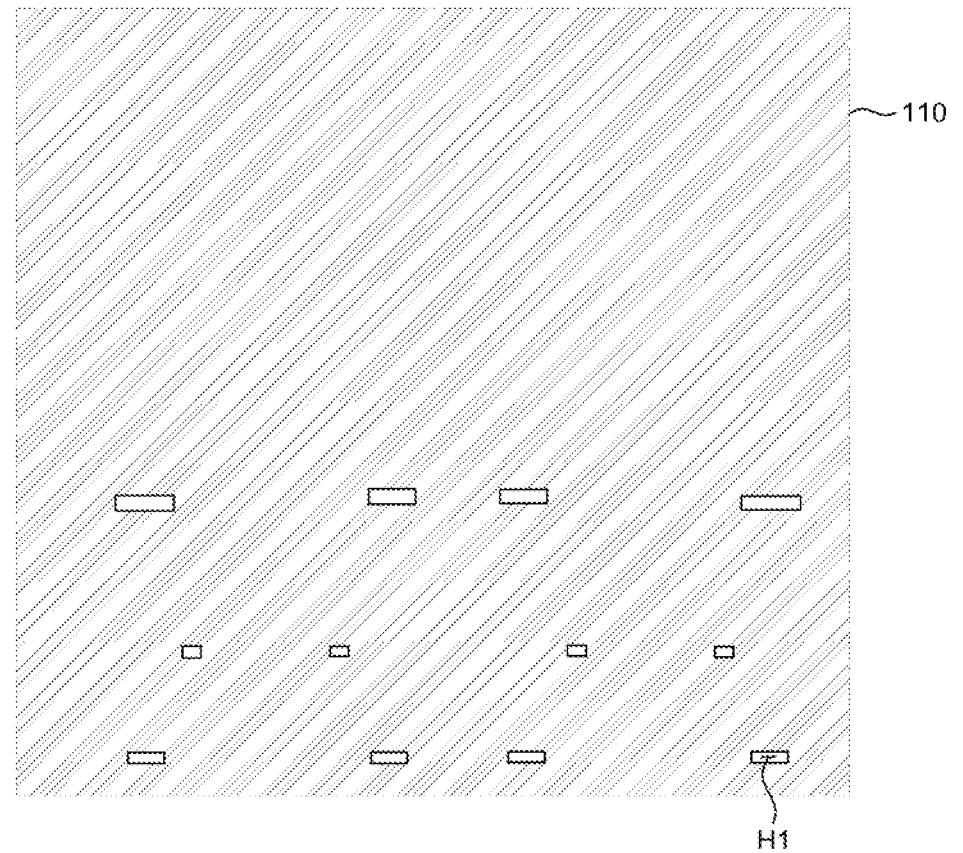
Figure 5:
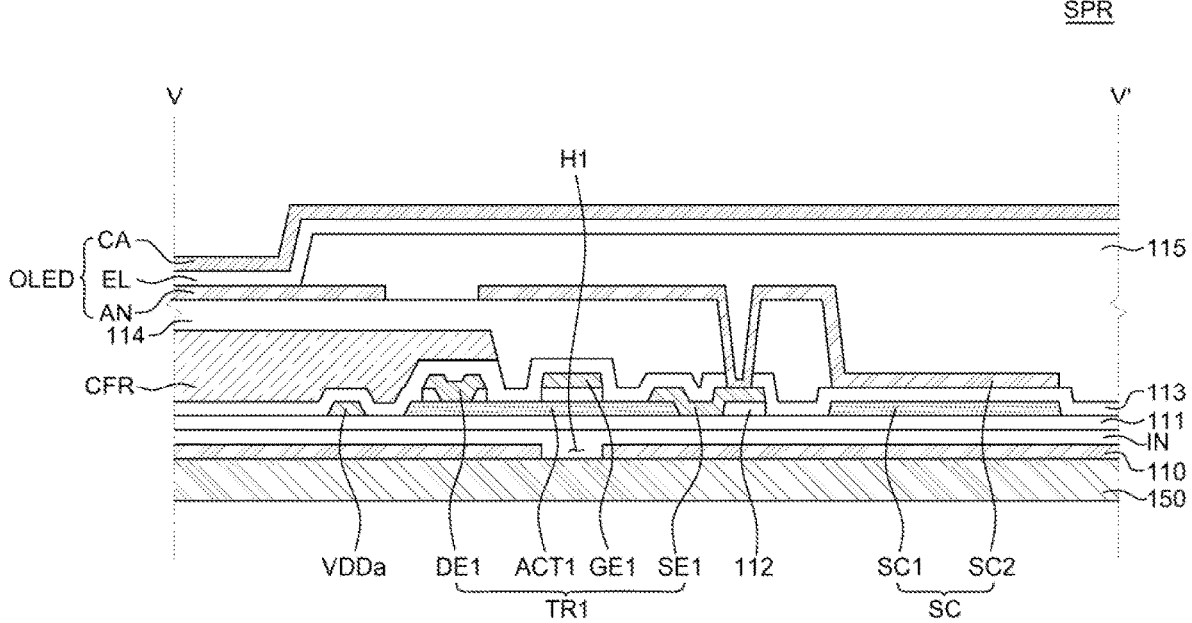
FIG. 5 is a cross-sectional view taken along a line V-V of FIG. 4.

FIGS. 4A to 4C are enlarged plan views of a display device according to an exemplary aspect of the present disclosure. FIG. 5 is a cross-sectional view taken along the line V-V' of FIG. 4A. FIG. 4A is an enlarged plan view of a red sub pixel SPR, a white sub pixel SPW, a blue sub pixel SPB, and a green sub pixel SPG which configure one pixel. FIG. 4B is an enlarged plan view of a circuit area of the plurality of sub pixels SP of a display device 100 according to an exemplary aspect of the present disclosure. FIG. 4C is an enlarged plan view of a substrate 110 of a display device 100 according to an exemplary aspect of the present disclosure. In FIG. 4A, for the convenience of description, the bank 115 is omitted and edges of the plurality of color filters CF are illustrated with a bold solid line. Further, in FIGS. 4A and 4B, with regard to the substrate 110, only a plurality of holes H1 of the substrate 110 is illustrated. Referring to FIGS. 4A to 4C, and 5, the display device 100 according to an exemplary aspect of the present disclosure includes a substrate 110, an insulating layer IN, a buffer layer 111, a gate insulating layer 112, a passivation layer 113, a planarization layer 114, a bank 115, a first transistor TR1, a second transistor TR2, a third transistor TR3, a storage capacitor SC, a light emitting diode OLED, a gate line GL, a sensing line SL, a data line DL, a reference line RL, a high potential power line VDD, and a plurality of color filters CF.

Referring to FIG. 4A, the plurality of sub pixels SP includes a red sub pixel SPR, a green sub pixel SPG, a blue sub pixel SPB, and a white sub pixel SPW. For example, the red sub pixel SPR, the white sub pixel SPW, the blue sub pixel SPB, and the green sub pixel SPG may be sequentially disposed along a row direction. However, the placement order of the plurality of sub pixels SP is not limited thereto.

Each of the plurality of sub pixels SP includes an emission area and a circuit area. The emission area is an area where one color light is independently emitted and the light emitting diode OLED may be disposed therein. An emission area of the red sub pixel SPR is a red light emission area which emits red light, an emission area of the green sub pixel SPG is a green light emission area which emits green light, and an emission area of the blue sub pixel SPB is a blue light emission area which emits blue light. Further, an emission area of the white sub pixel SPW is a white light emission area which emits white light.

In the circuit area, a driving circuit DP for driving the plurality of light emitting diodes OLED is disposed and a driving circuit DP including the first transistor TR1, the second transistor TR2, the third transistor TR3, and the storage capacitor SC may be disposed.

Referring to FIGS. 4A to 4C and 5, the insulating layer IN is disposed on the substrate 110 and a plurality of high potential power lines VDD, a plurality of data lines DL, and a plurality of reference lines RL are disposed on the insulating layer IN.

The plurality of high potential power lines VDD, the plurality of data lines DL, and the plurality of reference lines RL are disposed on the same layer on the substrate 110 to be formed of the same material. For example, the plurality of high potential power lines VDD, the plurality of data lines DL, and the plurality of reference lines RL may be configured by a conductive material such as copper (Cu), aluminum (Al), molybdenum (Mo), nickel (Ni), titanium (Ti), and chrome (Cr), or an alloy thereof, but are not limited thereto.

The plurality of high potential power lines VDD is wiring lines which transmit the high potential power signal to each of the plurality of sub pixels SP. The plurality of high potential power lines VDD may extend between the plurality of sub pixels SP in a column direction and two sub pixels SP which are adjacent to each other in the row direction may share one high potential power line VDD among the plurality of high potential power lines VDD. For example, one high potential power line VDD is disposed at a left side of the red sub pixel SPR to supply a high potential power voltage to the first transistor TR1 of each of the red sub pixel SPR and the white sub pixel SPW. The other high potential power line VDD is disposed at a right side of the green sub pixel SPG to supply a high potential power voltage to the first transistor TR1 of each of the blue sub pixel SPB and the green sub pixel SPG.

The plurality of data lines DL is lines which extend between the plurality of sub pixels SP in a column direction to transmit a data voltage to each of the plurality of sub pixels SP and includes a first data line DL1, a second data line DL2, a third data line DL3, and a fourth data line DL4. The first data line DL1 is disposed between the red sub pixel SPR and the white sub pixel SPW to transmit a data voltage to the second transistor TR2 of the red sub pixel SPR. The second data line DL2 is disposed between the first data line DL1 and the white sub pixel SPW to transmit the data voltage to the second transistor TR2 of the white sub pixel SPW. The third data line DL3 is disposed between the blue sub pixel SPB and the green sub pixel SPG to transmit a data voltage to the second transistor TR2 of the blue sub pixel SPB. The fourth data line DL4 is disposed between the third data line DL3 and the green sub pixel SPG to transmit the data voltage to the second transistor TR2 of the green sub pixel SPG.

The plurality of reference lines RL extends between the plurality of sub pixels SP in the column direction to transmit a reference voltage to each of the plurality of sub pixels SP. The plurality of sub pixels SP which forms one pixel may share one reference line RL. For example, one reference line RL is disposed between the white sub pixel SPW and the blue sub pixel SPB to transmit a reference voltage to a third transistor TR3 of each of the red sub pixel SPR, the white sub pixel SPW, the blue sub pixel SPB, and the green sub pixel SPG.

The buffer layer 111 is disposed on the plurality of high potential power lines VDD, the plurality of data lines DL, and the plurality of reference lines RL. The buffer layer 111 may reduce permeation of moisture or impurities through the substrate 110. For example, the buffer layer 111 may be configured by a single layer or a double layer of silicon oxide SiOx or silicon nitride SiNx, but is not limited thereto. Further, the buffer layer 111 may be omitted depending on a type of substrate 110 or a type of transistor, but is not limited thereto.

In each of the plurality of sub pixels SP, the first transistor TR1, the second transistor TR2, the third transistor TR3, and the storage capacitor SC are disposed on the buffer layer 111.

First, the first transistor TR1 includes a first active layer ACT1, a first gate electrode GE1, a first source electrode SE1, and a first drain electrode DE1.

The first active layer ACT1 is disposed on the buffer layer 111. The first active layer ACT1 may be formed of a semiconductor material such as an oxide semiconductor, amorphous silicon, or polysilicon, but is not limited thereto. For example, when the first active layer ACT1 is formed of an oxide semiconductor, the first active layer ACT1 is formed by a channel region, a source region, and a drain region and the source region and the drain region may be conductive regions, but are not limited thereto.

The gate insulating layer 112 is disposed on the first active layer ACT1. The gate insulating layer 112 is a layer for electrically insulating the first gate electrode GE1 from the first active layer ACT1 and may be formed of an insulating material. For example, the gate insulating layer 112 may be configured by a single layer or a double layer of silicon oxide SiOx or silicon nitride SiNx, but is not limited thereto.

The first gate electrode GE1 is disposed on the gate insulating layer 112 so as to overlap with the first active layer ACT1. The first gate electrode GE1 may be configured by a conductive material such as copper (Cu), aluminum (Al), molybdenum (Mo), nickel (Ni), titanium (Ti), and chrome (Cr), or an alloy thereof, but is not limited thereto.

A first source electrode SE1 and a first drain electrode DE1 which are spaced apart from each other are disposed on the gate insulating layer 112. The first source electrode SE1 and the first drain electrode DE1 may be electrically connected to the first active layer ACT1 through a contact hole formed in the gate insulating layer 112. The first source electrode SE1 and the first drain electrode DE1 may be disposed on the same layer as the first gate electrode GE1 to be formed of the same conductive material. For example, the first source electrode SE1 and the first drain electrode DE1 may be configured by copper (Cu), aluminum (Al), molybdenum (Mo), nickel (Ni), titanium (Ti), chrome (Cr), or an alloy thereof, but is not limited thereto.

The first drain electrode DE1 is electrically connected to the high potential power lines VDD. For example, the first drain electrodes DE1 of the red sub pixel SPR and the white sub pixel SPW may be electrically connected to the high potential power line VDD at the left side of the red sub pixel SPR. The first drain electrodes DE1 of the blue sub pixel SPB and the green sub pixel SPG may be electrically connected to the high potential power line VDD at the right side of the green sub pixel SPG.

At this time, an auxiliary high potential power line VDDa may be further disposed to electrically connect the first drain electrode DE1 with the high potential power line VDD. One end of the auxiliary high potential power line VDDa is electrically connected to the high potential power line VDD and the other end is electrically connected to the first drain electrode DE1 of each of the plurality of sub pixels SP. For example, when the auxiliary high potential power line VDDa is formed of the same material on the same layer as the first drain electrode DE1, one end of the auxiliary high potential power line VDDa is electrically connected to the high potential power line VDD through a contact hole formed in the gate insulating layer 112 and the buffer layer 111. The other end of the auxiliary high potential power line VDDa extends to the first drain electrode DE1 to be integrally formed with the first drain electrode DE1.

At this time, the first drain electrode DE1 of the red sub pixel SPR and the first drain electrode DE1 of the white sub pixel SPW which are electrically connected to the same high potential power lines VDD may be connected to the same auxiliary high potential power line VDDa. The first drain electrode DE1 of the blue sub pixel SPB and the first drain electrode DE1 of the green sub pixel SPG may also be connected to the same auxiliary high potential power line VDDa. However, the first drain electrode DE1 and the high potential power line VDD may be electrically connected by another method, but it is not limited thereto. In the meantime, even though in FIG. 5, it is illustrated that the gate insulating layer 112 is patterned so as to overlap with only the first gate electrode GE1, the first source electrode SE1, and the first drain electrode DE1, the gate insulating layer may be formed on the entire surface of the substrate 110, but is not limited thereto.

The second transistor TR2 includes a second active layer ACT2, a second gate electrode GE2, a second source electrode SE2, and a second drain electrode DE2.

The second active layer ACT2 is disposed on the buffer layer 111. The second active layer ACT2 may be formed of a semiconductor material such as an oxide semiconductor, amorphous silicon, or polysilicon, but is not limited thereto. For example, when the second active layer ACT2 is formed of an oxide semiconductor, the second active layer ACT2 may be formed by a channel region, a source region, and a drain region and the source region and the drain region may be conductive regions, but are not limited thereto.

The second source electrode SE2 is disposed on the buffer layer 111. The second source electrode SE2 may be integrally formed with the second active layer ACT2 to be electrically connected to each other. For example, the semiconductor material is formed on the buffer layer 111 and a part of the semiconductor material is conducted to form the second source electrode SE2. Therefore, a part of the semiconductor material which is not conducted may become a second active layer ACT2 and a conducted part may become a second source electrode SE2. However, the second active layer ACT2 and the second source electrode SE2 are separately formed, but it is not limited thereto.

The second source electrode SE2 is electrically connected to the first gate electrode GE1 of the first transistor TR1. The first gate electrode GE1 may be electrically connected to the second source electrode SE2 through a contact hole formed in the gate insulating layer 112. Accordingly, the first transistor TR1 may be turned on or turned off by a signal from the second transistor TR2.

The gate insulating layer 112 is disposed on the second active layer ACT2 and the second source electrode SE2, and the second drain electrode DE2 and the second gate electrode GE2 are disposed on the gate insulating layer 112.

The second gate electrode GE2 is disposed on the gate insulating layer 112 so as to overlap with the second active layer ACT2. The second gate electrode GE2 may be electrically connected to the gate line GL, and the second transistor TR2 may be turned on or turned off based on the gate voltage transmitted to the second gate electrode GE2. The second gate electrode GE2 may be configured by a conductive material such as copper (Cu), aluminum (Al), molybdenum (Mo), nickel (Ni), titanium (Ti), chrome (Cr), or an alloy thereof, but is not limited thereto.

In the meantime, the second gate electrode GE2 may extend from the gate line GL. That is, the second gate electrode GE2 is integrally formed with the gate line GL, and the second gate electrode GE2 and the gate line GL may be formed of the same conductive material. For example, the gate line GL may be configured by copper (Cu), aluminum (Al), molybdenum (Mo), nickel (Ni), titanium (Ti), chrome (Cr), or an alloy thereof, but is not limited thereto.

The gate line GL is a wiring line which transmits the gate voltage to each of the plurality of sub pixels SP and intersects the circuit area of the plurality of sub pixels SP to extend in the row direction. The gate line GL extends in the row direction to intersect the plurality of high potential power lines VDD, the plurality of data lines DL, and the plurality of reference lines RL extending in the column direction.

The second drain electrode DE2 is disposed on the gate insulating layer 112. The second drain electrode DE2 is electrically connected to the second active layer ACT2 through a contact hole formed in the gate insulating layer 112, and is electrically connected to one of the plurality of data lines DL through a contact hole formed in the gate insulating layer 112 and the buffer layer 111, simultaneously. For example, the second drain electrode DE2 of the red sub pixel SPR is electrically connected to the first data line DL1 and the second drain electrode DE2 of the white sub pixel SPW may be electrically connected to the second data line DL2. For example, the second drain electrode DE2 of the blue sub pixel SPB is electrically connected to the third data line DL3 and the second drain electrode DE2 of the green sub pixel SPG may be electrically connected to the fourth data line DL4. The second drain electrode DE2 may be configured by a conductive material such as copper (Cu), aluminum (Al), molybdenum (Mo), nickel (Ni), titanium (Ti), chrome (Cr), or an alloy thereof, but is not limited thereto.

The third transistor TR3 includes a third active layer ACT3, a third gate electrode GE3, a third source electrode SE3, and a third drain electrode DE3.

The third active layer ACT3 is disposed on the buffer layer 111. The third active layer ACT3 may be formed of a semiconductor material such as an oxide semiconductor, amorphous silicon, or polysilicon, but is not limited thereto. For example, when the third active layer ACT3 is formed of an oxide semiconductor, the third active layer ACT3 is formed by a channel region, a source region, and a drain region and the source region and the drain region may be conductive regions, but are not limited thereto.

The gate insulating layer 112 is disposed on the third active layer ACT3, and the third gate electrode GE3, the third source electrode SE3, and the third drain electrode DE3 are disposed on the gate insulating layer 112.

The third gate electrode GE3 is disposed on the gate insulating layer 112 so as to overlap with the third active layer ACT3. The third gate electrode GE3 may be electrically connected to the sensing line SL and the third transistor TR3 may be turned on or turned off based on the sensing voltage transmitted to the third transistor TR3. The third gate electrode GE3 may be configured by a conductive material such as copper (Cu), aluminum (Al), molybdenum (Mo), nickel (Ni), titanium (Ti), chrome (Cr), or an alloy thereof, but is not limited thereto.

In the meantime, the third gate electrode GE3 may extend from the sensing line SL. That is, the third gate electrode GE3 may be integrally formed with the sensing line SL, and the third gate electrode GE3 and the sensing line SL may be formed of the same material. For example, the sensing line SL may be configured by copper (Cu), aluminum (Al), molybdenum (Mo), nickel (Ni), titanium (Ti), chrome (Cr), or an alloy thereof, but is not limited thereto.

The sensing line SL transmits a sensing voltage to each of the plurality of sub pixels SP and extends between the plurality of sub pixels SP in a row direction. For example, the sensing line SL extends at a boundary between the plurality of sub pixels SP in the row direction to intersect the plurality of high potential power lines VDD, the plurality of data lines DL, and the plurality of reference lines RL extending in the column direction.

The third source electrode SE3 may be electrically connected to the third active layer ACT3 through a contact hole formed on the gate insulating layer 112. The third source electrode SE3 may be configured by a conductive material such as copper (Cu), aluminum (Al), molybdenum (Mo), nickel (Ni), titanium (Ti), chrome (Cr), or an alloy thereof, but is not limited thereto.

The third drain electrode DE3 may be electrically connected to the third active layer ACT3 through a contact hole formed on the gate insulating layer 112. The third drain electrode DE3 may be configured by a conductive material such as copper (Cu), aluminum (Al), molybdenum (Mo), nickel (Ni), titanium (Ti), chrome (Cr), or an alloy thereof, but is not limited thereto.

The third drain electrode DE3 may be electrically connected to the reference line RL. For example, the third drain electrodes DE3 of each of the red sub pixel SPR, the white sub pixel SPW, the blue sub pixel SPB, and the green sub pixel SPG may be electrically connected to the same reference line RL. That is, the plurality of sub pixels SP which forms one pixel may share one reference line RL.

At this time, an auxiliary reference line RLa may be disposed to transmit the reference line RL extending in the column direction to the plurality of sub pixels SP which is disposed in parallel along the row direction. The auxiliary reference line RLa extends in the row direction to electrically connect the reference line RL and the third drain electrode DE3 of each of the plurality of sub pixels SP. One end of the auxiliary reference line RLa may be electrically connected to the reference line RL through a contact hole formed in the buffer layer 111 and the gate insulating layer 112. The other end of the auxiliary reference line RLa may be electrically connected to the third drain electrode DE3 of each of the plurality of sub pixels SP. In this case, the auxiliary reference line RLa may be integrally formed with the third drain electrode DE3 of each of the plurality of sub pixels SP, and a reference voltage from the reference line RL may be transmitted to the third drain electrode DE3 by means of the auxiliary reference line RLa. However, the auxiliary reference line RLa may be separately formed from the third drain electrode DE3, but is not limited thereto.

The storage capacitor SC is disposed in the circuit area of the plurality of sub pixels SP. The storage capacitor SC may store a voltage between the first gate electrode GE1 and the first source electrode SE1 of the first transistor TR1 so that the light emitting diode OLED continuously maintains a constant state for one frame. The storage capacitor SC includes a first capacitor electrode SC1 and a second capacitor electrode SC2.

First, in each of the plurality of sub pixels SP, the first capacitor electrode SC1 is disposed between the buffer layer 111 and the passivation layer 113. The first capacitor electrode SC1 may be integrally formed with the first active layer ACT1 and be electrically connected to the first source electrode SE1 by means of the first active layer ACT1.

The first capacitor electrode SC1 is integrally formed with the second source electrode SE2 to be electrically connected to the second source electrode SE2 and the first gate electrode GE1. For example, the semiconductor material is formed on the buffer layer 111 and a part of the semiconductor material is conducted to form the second source electrode SE2 and the first capacitor electrode SC1. Accordingly, a part of the semiconductor material which is not conducted functions as a second active layer ACT2 and the conducted part may function as a second source electrode SE2 and the first capacitor electrode SC1. As described above, the first gate electrode GE1 is electrically connected to the second source electrode SE2 through the contact hole formed in the gate insulating layer 112. Accordingly, the first capacitor electrode SC1 is integrally formed with the second source electrode SE2 to be electrically connected to the second source electrode SE2 and the first gate electrode GE1.

The buffer layer 111 is disposed on the first capacitor electrode SC1 and the second capacitor electrode SC2 is disposed on the buffer layer 111. The second capacitor electrode SC2 may be disposed so as to overlap with the first capacitor electrode SC1. The second capacitor electrode SC2 is integrally formed with the anode AN and is electrically connected to the first source electrode SE1 through the contact hole. In summary, the first capacitor electrode SC1 of the storage capacitor SC is integrally formed with the second source electrode SE2 and the second active layer ACT2 to be electrically connected to the second source electrode SE2 and the first gate electrode GE1. The second capacitor electrode SC2 is integrally formed with the anode AN and is electrically connected to the anode AN, the first source electrode SE1, and the third source electrode SE3. Accordingly, while the light emitting diode OLED emits light, the first capacitor electrode SC1 and the second capacitor electrode SC2 which overlap with the passivation layer 113 therebetween may constantly maintain the voltage of the first gate electrode GE1 and the first source electrode SE1 of the first transistor TR1 to maintain the constant state of the light emitting diode OLED.

The passivation layer 113 is disposed on the first transistor TR1, the second transistor TR2, the third transistor TR3, and the storage capacitor SC. The passivation layer 113 is an insulating layer for protecting components below the passivation layer 113. For example, the passivation layer 113 may be configured by a single layer or a double layer of silicon oxide SiOx or silicon nitride SiNx, but is not limited thereto. Further, the passivation layer 113 may be omitted depending on an exemplary aspect.

A plurality of color filters CF may be disposed in the emission area of each of the plurality of sub pixels SP on the passivation layer 113. As described above, the display device 100 according to an exemplary aspect of the present disclosure is a bottom emission type in which light emitted from the light emitting diode OLED is directed to the lower portion of the light emitting diode OLED and the substrate 110. Therefore, the plurality of color filters CF may be disposed below the light emitting diode OLED. Light emitted from the light emitting diode OLED passes through the plurality of color filters CF and may be implemented as various colors of light.

The plurality of color filters CF includes a red color filter CFR, a blue color filter CFB, and a green color filter CFG. The red color filter CFR may be disposed in an emission area of a red sub pixel SPR of the plurality of sub pixels SP, the blue color filter CFB may be disposed in an emission area of the blue sub pixel SPB, and the green color filter CFG may be disposed in an emission area of the green sub pixel SPG.

The planarization layer 114 is disposed on the passivation layer 113 and the plurality of color filters CF. The planarization layer 114 is an insulating layer which planarizes an upper portion of the substrate 110 on which the first transistor TR1, the second transistor TR2, the third transistor TR3, the storage capacitor SC, the plurality of high potential power lines VDD, the plurality of data lines DL, the plurality of reference lines RL, the plurality of gate lines GL, and the plurality of sensing lines SL are disposed. The planarization layer 114 may be formed of an organic material, and for example, may be configured by a single layer or a double layer of polyimide or photo acryl, but is not limited thereto.

The light emitting diode OLED is disposed in an emission rea of each of the plurality of sub pixels SP. The light emitting diode OLED is disposed on the planarization layer 114 in each of the plurality of sub pixels SP. The light emitting diode OLED includes an anode AN, an emission layer EL, and a cathode CA.

The anode AN is disposed on the planarization layer 114 in the emission area. The anode AN supplies holes to the emission layer EL so that the anode may be formed of a conductive material having a high work function. For example, the anode AN may be formed of a transparent conductive material such as indium tin oxide (ITO) and indium zinc oxide (IZO), but is not limited thereto.

In the meantime, the anode AN may extend to the circuit area. A part of the anode AN may extend toward the first source electrode SE1 of the circuit area from the emission area and be electrically connected to the first source electrode SE1 through a contact hole formed in the planarization layer 114 and the passivation layer 113. Accordingly, the anode AN of the light emitting diode OLED extends to the circuit area to be electrically connected to the first source electrode SE1 of the first transistor TR1 and the second capacitor electrode SC2 of the storage capacitor SC.

In the emission area EA and the circuit area CA, the emission layer EL is disposed on the anode AN. The emission layer EL may be formed as one layer over the plurality of sub pixels SP. That is, the emission layers EL of each of the plurality of sub pixels SP are connected to each other to be integrally formed. The emission layer EL may be configured by one emission layer or may have a structure in which a plurality of emission layers which emits different color light is laminated. The emission layer EL may further include an organic layer such as a hole injection layer, a hole transport layer, an electron transport layer, and an electron injection layer.

The cathode CA is disposed on the emission layer EL in the emission area and the circuit area. The cathode CA supplies electrons to the emission layer EL so that the cathode may be formed of a conductive material having a low work function. The cathode CA may be formed as one layer over the plurality of sub pixels SP. That is, the cathodes CA of each of the plurality of sub pixels SP are connected to be integrally formed. For example, the cathode CA may be formed of a transparent conductive material such as indium tin oxide (ITO) and indium zinc oxide (IZO) or ytterbium (Yb) alloy and may further include a metal doping layer, but is not limited thereto. Even though it is not illustrated in FIGS. 4 and 5, the cathode CA of the light emitting diode OLED is electrically connected to the low potential power line VSS to be supplied with a low potential power voltage.

A bank 115 is disposed between the anode AN and the emission layer EL. The bank 115 is disposed to overlap with the active area AA and cover the edge of the anode AN. The bank 115 is disposed at the boundary between the sub pixels SP which are adjacent to each other to reduce the mixture of light emitted from the light emitting diode OLED of each of the plurality of sub pixels SP. The bank 115 may be formed of an insulating material such as polyimide, acryl, or benzocyclobutene (BCB) based resin, but it is not limited thereto.

In the display device 100 according to an exemplary aspect of the present disclosure, the substrate 110 is formed of a transparent conductive oxide to reduce a thickness of the display device 100. In the related art, as the substrate of the display device, a plastic substrate or a glass substrate is mainly used, but there is a problem in that it is difficult to form the plastic substrate or the glass substrate to have a thickness which is equal to or lower than a predetermined level. In contrast, a transparent conductive oxide may be formed to have a very thin thickness by the deposition process such as sputtering. Therefore, in the display device 100 according to an exemplary aspect of the present disclosure, a substrate 100 which supports various components of the display device 100 is configured by a transparent conductive oxide layer to reduce a thickness of the display device 100 and implement a slim design.

Referring to FIGS. 4A and 4B, a plurality of holes H1 may be disposed in the substrate 110 so as to correspond to a channel region in which the first gate electrode GEL and the first active layer ACT1 overlap with, a channel region in which the second gate electrode GE2 and the second active layer ACT2 overlap with, and a channel region in which the third gate electrode GE3 and the third active layer ACT3 overlap with.

When a voltage is applied to a plurality of gate electrodes GE1, GE2, and GE3, a channel region in which electrons or holes move between the source electrodes SE1, SE2, and SE3 and the drain electrodes DE1, DE2, and DE3 is formed in a plurality of active layers ACT1, ACT2, and ACT3. If the plurality of holes H1 is not disposed in the substrate 110, a parasitic capacitance is generated between the substrate 110 formed of a transparent conductive oxide or an oxide semiconductor and a plurality of floating active layers ACT1, ACT2, and ACT3 to interrupt the movement of the electrons or holes in the channel region. Accordingly, in order to suppress the generation of the parasitic capacitance, the plurality of holes H1 may be formed in the substrate 110 so as to overlap with the channel region.

In the display device 100 according to an exemplary aspect of the present disclosure, the substrate 110 is formed of any one of a transparent conductive oxide or an oxide semiconductor to reduce a thickness of the display device 100. In the related art, the plastic substrate has been mainly used as the substrate of the display device. However, the plastic substrate is formed by coating and curing a substrate material at a high temperature so that there are problems in that it takes a long time and it is difficult to form the thickness to be equal to or lower than a predetermined level. In contrast, a transparent conductive oxide or an oxide semiconductor may be formed to have a very thin thickness by the deposition process such as sputtering. Therefore, in the display device 100 according to an exemplary aspect of the present disclosure, a substrate 100 which supports various components of the display device 100 is configured by a transparent conductive oxide layer or an oxide semiconductor layer to reduce a thickness of the display device 100 and implement a slim design.

In the meantime, a flexible display device is formed by forming a light emitting diode and a driving circuit on a plastic substrate which is relatively more flexible than the glass substrate. However, when the display device is excessively deformed, the display device may be damaged due to a stress generated during the deformation. Accordingly, in order to improve the flexibility to relieve the stress of the display device, it is advantageous to reduce the thickness of the display device. However, as described above, it is difficult to form the plastic substrate to have a thickness which is equal to or smaller than a predetermined thickness.

Accordingly, in the display device 100 according to an exemplary aspect of the present disclosure, the substrate 110 is formed of a transparent conductive oxide or an oxide semiconductor to improve the flexibility of the display device 100 and reduce the stress generated when the display device 100 is deformed. Specifically, when the substrate 110 is configured by a transparent conductive oxide layer or an oxide semiconductor, the substrate 110 may be formed as a very thin film. In this case, the substrate 110 may be also referred to as a first transparent thin film layer. Accordingly, the display device 100 including a substrate 110 may have a high flexibility and the display device 100 may be easily bent or rolled. Therefore, in the display device 100 according to an exemplary aspect of the present disclosure, the substrate 110 is formed by any one of a transparent conductive oxide layer and an oxide semiconductor to improve the flexibility of the display device 100. Accordingly, the stress generated when the display device 100 is deformed is also relieved so that the crack caused in the display device 100 may be minimized.

In the meantime, even though the flexible display device is implemented using a plastic substrate, instead of the glass substrate, the plastic substrate is more likely to generate static electricity than the glass substrate. The static electricity affects various wiring lines and the driving element on the plastic substrate so that some components may be damaged, or the display quality of the display device may be degraded. Accordingly, in the display device in which the plastic substrate is used, a separate configuration for blocking and discharging the static elasticity is further necessary.

In the display device 100 according to an exemplary aspect of the present disclosure, the substrate 110 is formed of any one of a transparent conductive oxide layer and an oxide semiconductor layer to reduce the possibility of generating the static electricity in the substrate 110. If the substrate 110 is formed of plastic so that the static electricity is generated, various wiring lines and driving elements on the substrate 110 are damaged, or the driving is affected due to the static electricity to degrade the display quality. Instead, when the substrate 110 is formed of a transparent conductive oxide layer or an oxide semiconductor layer, the static electricity generated in the substrate 110 is minimized and a configuration for blocking and discharging the static electricity may be simplified. Accordingly, in the display device 100 according to an exemplary aspect of the present disclosure, the substrate 110 is formed of any one of a transparent conductive oxide layer or an oxide semiconductor having a low possibility of generating the static electricity. By doing this, the damage or the display quality degradation due to the static electricity may be minimized.

In the meantime, when the plastic substrate is used as the substrate of the display device, foreign materials may be generated during the process of forming the plastic substrate. For example, in order to form a plastic substrate, when a substrate material is coated and cured, the foreign materials may be generated. Due to the foreign materials, the moisture or oxygen may more easily permeate into the display device so that various configurations on the substrate may be non-uniformly formed due to the foreign materials. Accordingly, the light emitting diode in the display device may be deteriorated or the characteristic of the transistor may be degraded due to the foreign materials, in the plastic substrate formed by the coating and curing methods.

In contrast, in the display device 100 according to an exemplary aspect of the present disclosure, the substrate 110 is formed of one of a transparent conductive oxide or an oxide semiconductor to minimize the permeation of the moisture or oxygen of the outside into the display device 100 by means of the substrate 110. When the substrate 110 is formed of a transparent conductive oxide layer or an oxide semiconductor, the substrate 110 is formed in the vacuum environment so that the foreign material generation possibility is significantly low. Further, even though the foreign material is generated, the size of the foreign material is very small so that the permeation of the moisture and oxygen into the display device 100 may be minimized. Accordingly, in the display device 100 according to an exemplary aspect of the present disclosure, the substrate 110 is formed of a transparent conductive oxide or an oxide semiconductor having a low possibility of generating the foreign materials and an excellent moisture permeation performance. By doing this, the reliability of the light emitting diode OLED including an organic layer and the display device 100 may be improved.

In the display device 100 according to an exemplary aspect of the present disclosure, the substrate 110 is formed of any one of a transparent conductive oxide or an oxide semiconductor to attach a barrier film which is thin and cheap below the substrate 110. When the substrate 110 is formed of a material having a low moisture permeation performance, for example, plastic, the moisture permeability may be supplemented by attaching a high performance barrier film. However, in the display device 100 according to an exemplary aspect of the present disclosure, the substrate 110 is formed of a transparent conductive oxide or an oxide semiconductor having an excellent moisture permeation performance so that a thin and cheap barrier film may be attached below the substrate 110. Accordingly, in the display device 100 according to an exemplary aspect of the present disclosure, the substrate 110 is configured by any one of a transparent conductive oxide or an oxide semiconductor having an excellent moisture permeation performance to reduce the manufacturing cost of the display device.

In the display device 100 according to an exemplary aspect of the present disclosure, the substrate 110 is formed of any one of a transparent conductive oxide or an oxide semiconductor to perform a laser lift off (LLO) process. When the display device 100 is manufactured, a temporary substrate in which a sacrificial layer is formed is attached below the substrate 110 and then a pixel unit 120 may be formed on the substrate 110. The sacrificial layer may use, for example, a hydrogenated amorphous silicon or an amorphous silicon which is hydrogenated and doped with impurities. After completing the manufacturing of the display device 100, when a laser is irradiated from the lower portion of the temporary substrate, the hydrogen of the sacrificial layer is dehydrogenated, and the sacrificial layer and the temporary substrate may be separated from the substrate 110. At this time, a transparent conductive oxide and an oxide semiconductor are materials which may perform the LLO process with the sacrificial layer and the temporary substrate. Therefore, even though the substrate 110 is formed of any one of a transparent conductive oxide or an oxide semiconductor, the substrate 110 may be easily separated from the temporary substrate. Accordingly, in the display device 100 according to an exemplary aspect of the present disclosure, the substrate 110 is configured by any one of a transparent conductive oxide layer or an oxide semiconductor which may perform the LLO process. Therefore, the display device 100 may be easily manufactured with the existing process and equipment.

Various elements such as a plurality of wiring lines and transistors are disposed on the substrate. A voltage is applied thereto so that the current flows and various electric fields may be formed by the influence thereof. The substrate which is a transparent conductive oxide or an oxide semiconductor layer is affected by various electric fields so that electrons are gathered in a part of the substrate and the holes are gathered in the other part to form polarizations, that is, different electric fields. The electric fields formed on the substrate may affect characteristics of various configurations disposed on the substrate.

For example, the parasitic capacitance formed in a partial area of the substrate 110 which overlap with the plurality of thin film transistors TR1, TR2, and TR3 interrupts the movement of the electrons or holes in the active layers ACT1, ACT2, and ACT3 of the plurality of thin film transistors TR1, TR2, and TR3. Therefore, it is not easy to form the channel region. Specifically, when the first transistor TR1 which is a driving transistor which controls a grayscale of the light emitting diode OLED is affected by the parasitic capacitance, it is difficult to control the grayscale of the light emitting diode OLED and a defect such as afterimage may be generated.

Therefore, in the display device 100 according to an exemplary aspect of the present disclosure, the substrate 110 is formed by any one of a transparent conductive oxide or an oxide semiconductor, and the plurality of holes H1 overlapping with the channel region is disposed in the substrate 110. By doing this, the parasitic capacitance formed between the substrate 110 and the active layers ACT1, ACT2, and ACT3 of the plurality of thin film transistors TR1, TR2, and TR3 may be minimized. Further, the problem in that the mobility of the electrons or holes of the channel region is lowered when the substrate 110 formed of a transparent conductive oxide or an oxide semiconductor overlap with the active layers ACT1, ACT2, and ACT3 of the plurality of thin film transistors TR1, TR2, and TR3 is suppressed. Furthermore, the reliability of the display device 100 is improved. Accordingly, in the display device 100 according to an exemplary aspect of the present disclosure, a plurality of holes H1 is disposed in the substrate 110 so as to overlap with the channel region of the active layers ACT1, ACT2, and ACT3 so that the substrate 110 may be formed as a very thin film and the reliability of the thin film transistors TR1, TR2, and TR3 may be improved.

Figure 6:
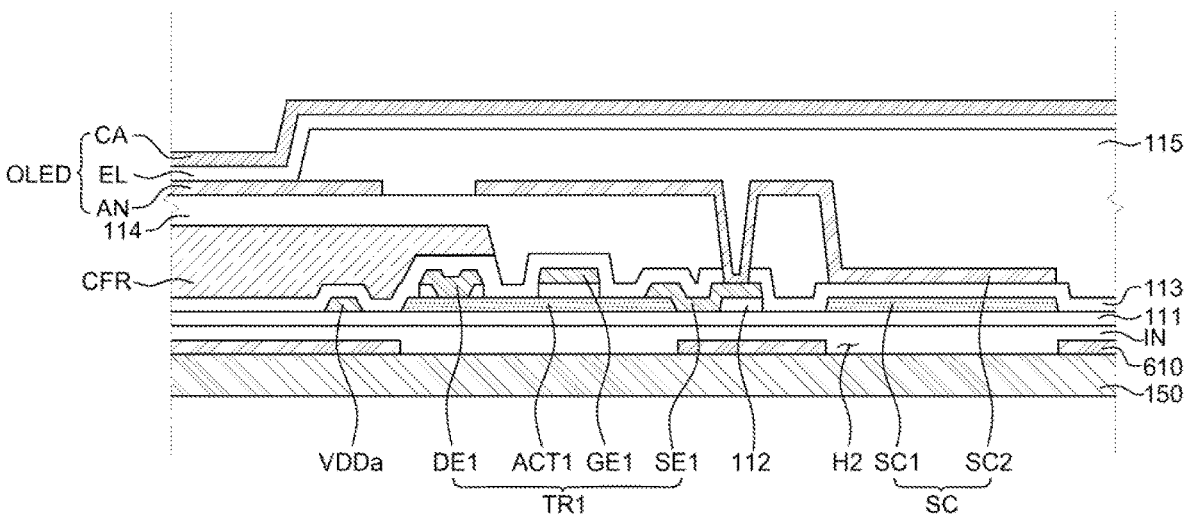
FIG. 6 is a plan view of a display device according to another exemplary aspect of the present disclosure.

FIG. 6 is a plan view of a display device according to another exemplary aspect of the present disclosure. The only difference between a display device 600 of FIG. 6 and the display device 100 of FIGS. 1 to 5 is a substrate 610, but the other configuration is substantially the same, so that a redundant description will be omitted.

Referring to FIG. 6, a plurality of holes H2 may be disposed in the substrate 610 so as to correspond to an area overlapping with a first active layer ACT1, a second active layer ACT2, and a third active layer ACT3.

When a voltage is applied to the plurality of gate electrodes GE1, GE2, and GE3, a channel region in which electrons or holes move between the source electrodes SE1, SE2, and SE3 and the drain electrodes DE1, DE2, and DE3 is formed in the plurality of active layers ACT1, ACT2, and ACT3. If the plurality of holes H2 is not disposed, a parasitic capacitance may be generated between the substrate 110 formed of a transparent conductive oxide or an oxide semiconductor and a plurality of floating active layers ACT1, ACT2, and ACT3. Accordingly, in order to suppress the generation of the parasitic capacitance, the plurality of holes H2 is formed in the substrate 610 so as to overlap with all the plurality of active layers ACT1, ACT2, and ACT3 including the channel region.

Therefore, in the display device 600 according to another exemplary aspect of the present disclosure, the plurality of holes H2 is disposed so as to correspond to the entire area of the plurality of active layers ACT1, ACT2, and ACT3. By doing this, influence on various components disposed on the substrate 610 caused by an electric field formed in the substrate 610 which is a transparent conductive oxide or an oxide semiconductor layer may be minimized. Further, the problem in that the mobility of the electrons or holes of the channel region is lowered due to the overlapping with of the substrate 610 and the active layers ACT1, ACT2, and ACT3 of the plurality of thin film transistors TR1, TR2, and TR3 is suppressed and the reliability of the display device 600 is improved. Accordingly, in the display device 600 according to another exemplary aspect of the present disclosure, the plurality of holes H2 is disposed in the substrate 110 so as to overlap with the active layers ACT1, ACT2, and ACT3 including the channel region. Therefore, the substrate 110 may be formed as a very thin film and the reliability of the thin film transistors TR1, TR2, and TR3 may be improved.

Figure 7A:
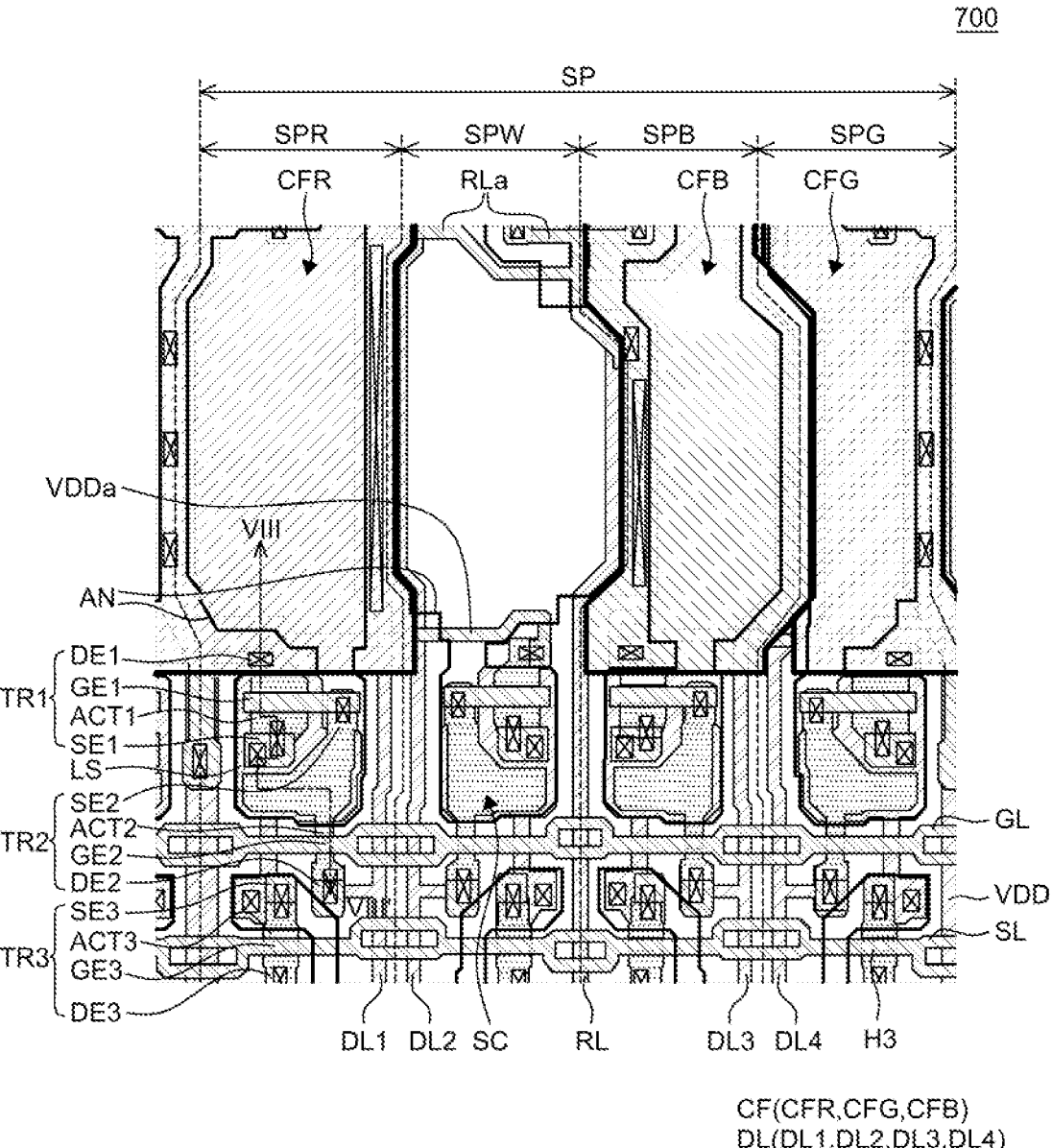
FIGS. 7A to 7C are enlarged plan views of a display device according to still another exemplary aspect of the present disclosure.
Figure 7B:
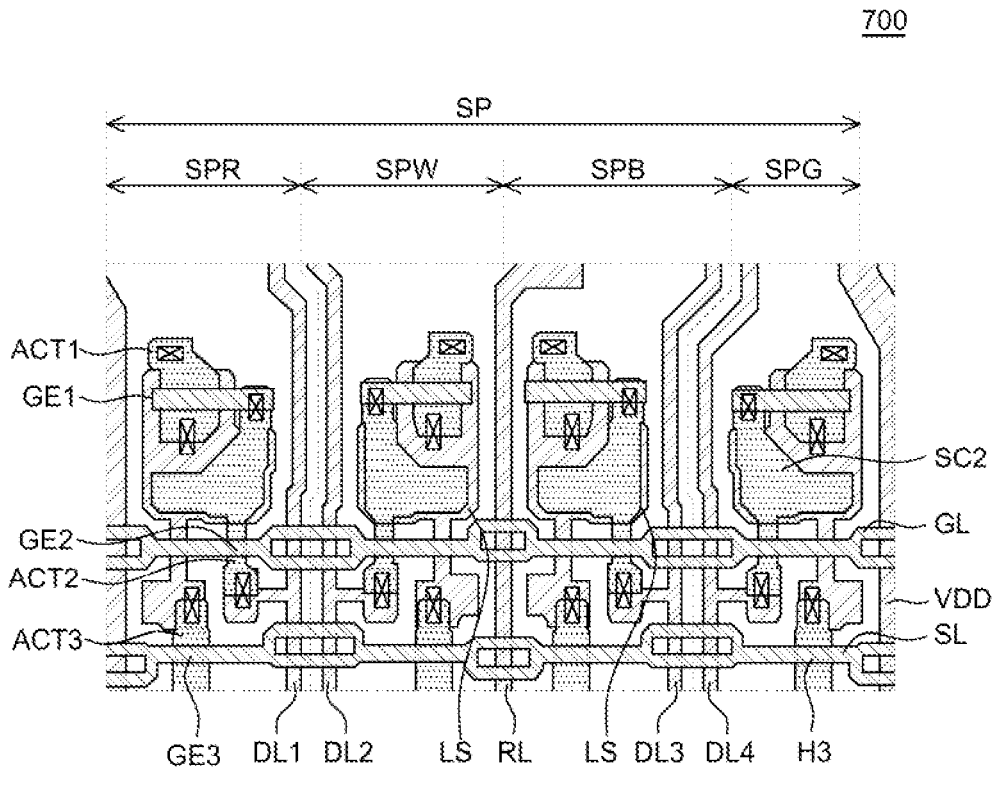
Figure 7C:
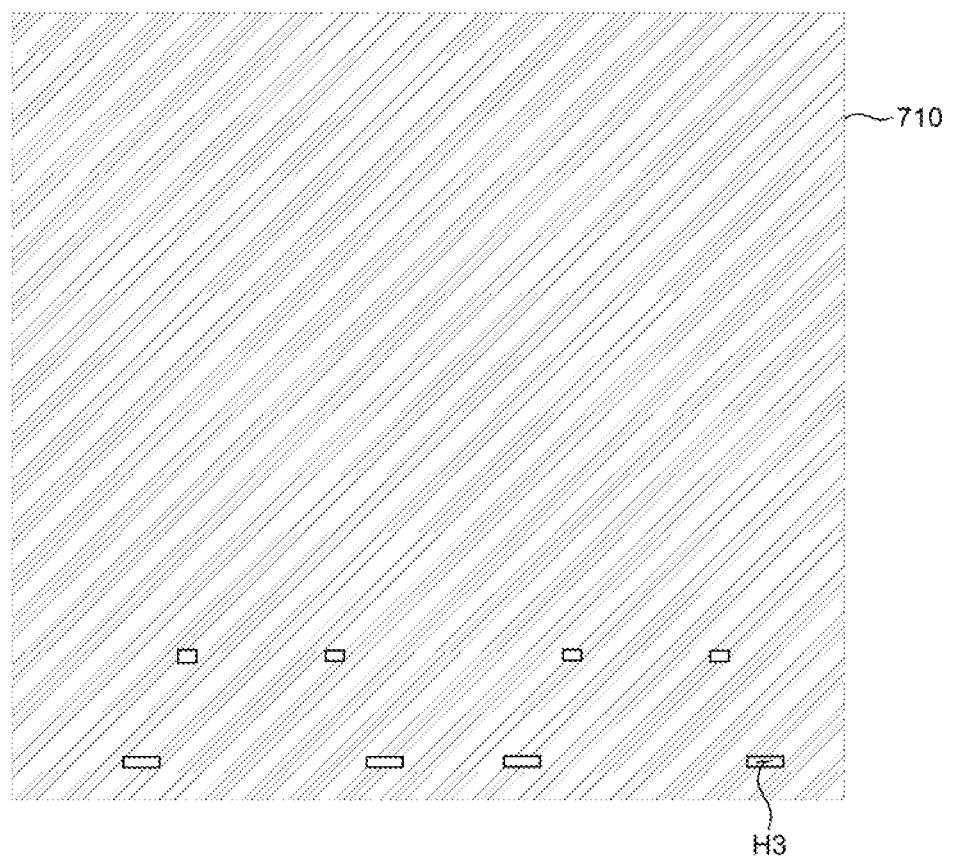
Figure 8:
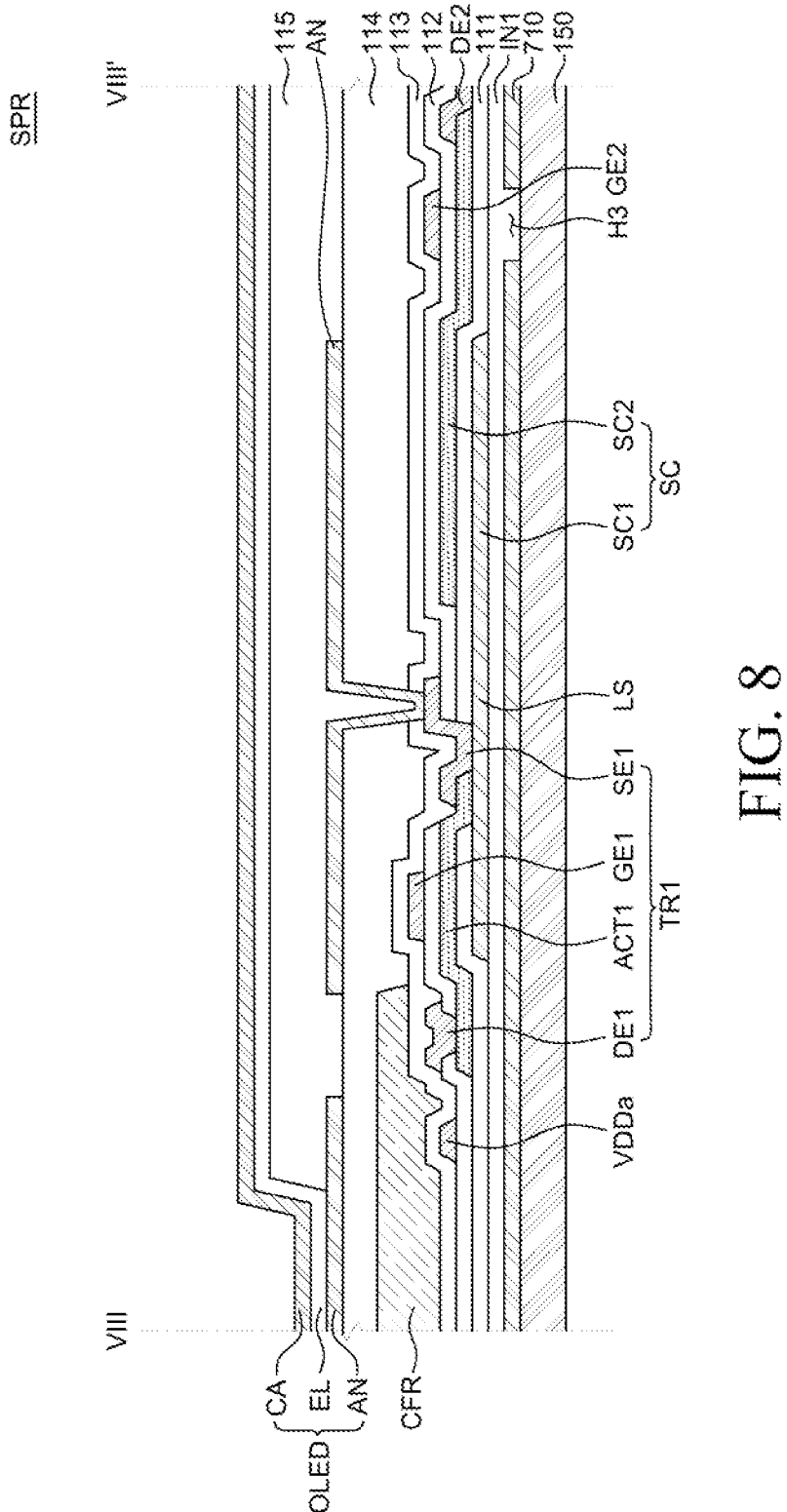
FIG. 8 is a schematic cross-sectional view of a display device taken along a line VIII-VIII' of FIG. 7.

FIGS. 7A to 7C are enlarged plan views of a display device according to still another exemplary aspect of the present disclosure. FIG. 8 is a schematic cross-sectional view of a display device taken along the line VIII-VIII' of FIG. 7. The only difference between a display device 700 of FIGS. 7A to 7C and 8 and the display device 100 of FIGS. 1 to 5 is a light shielding layer LS and a substrate 710, but the other configuration is substantially the same, so that a redundant description will be omitted. Further, in FIGS. 7A and 7B, with regard to the substrate 710, only a plurality of holes H3 of the substrate 710 is illustrated.

Referring to FIGS. 7A to 7C and 8, the insulating layer IN is disposed on the substrate 710 and a plurality of high potential power line VDD, a plurality of data lines DL, a plurality of reference lines RL, and the light shielding layer LS are disposed on the insulating layer IN.

The light shielding layer LS is disposed on the same layer as the plurality of high potential power lines VDD, the plurality of data lines DL, the plurality of reference lines RL, and the substrate 710 to be formed of the same conductive material. For example, the plurality of high potential power lines VDD, the plurality of data lines DL, the plurality of reference lines RL, and the light shielding layer LS may be configured by a conductive material such as copper (Cu), aluminum (Al), molybdenum (Mo), nickel (Ni), titanium (Ti), chrome (Cr), or an alloy thereof, but are not limited thereto.

The light shielding layer LS is disposed on the insulating layer IN. The light shielding layer LS is disposed so as to overlap with the first active layer ACT1 of at least the first active layer ACT1 of the first transistor TR1 among the plurality of transistors TR1, TR2, and TR3 to block light incident onto the first active layer ACT1. If light is irradiated onto the first active layer ACT1, a leakage current is generated so that the reliability of the first transistor TR1 which is a driving transistor may be degraded. At this time, if the light shielding layer LS configured by an opaque conductive material such as copper (Cu), aluminum (Al), molybdenum (Mo), nickel (Ni), titanium (Ti), chrome (Cr), or an alloy thereof is disposed so as to overlap with the first active layer ACT1, light incident from the lower portion of the substrate onto the first active layer ACT may be blocked. Accordingly, the reliability of the first transistor TR1 may be improved. However, it is not limited thereto and the light shielding layer LS may be disposed so as to overlap with the second active layer ACT2 of the second transistor TR2 and the third active layer ACT3 of the third transistor TR3.

In the meantime, even though in the drawing, it is illustrated that the light single layer LS is a single layer, the light shielding layer LS may be formed as a plurality of layers. For example, the light shielding layer LS may be formed of a plurality of layers disposed so as to overlap with at least one of the insulating layer IN, the buffer layer 111, the gate insulating layer 112, and the passivation layer 113 therebetween.

The first source electrode SE1 may be electrically connected to the light shielding layer LS through a contact hole formed on the gate insulating layer 112 and the buffer layer 111. Further, a part of the first active layer ACT1 connected to the first source electrode SE1 may be electrically connected to the light shielding layer LS through a contact hole formed on and the buffer layer 111. If the light shielding layer LS is floated, a threshold voltage of the first transistor TR1 varies to affect the driving of the display device 100. Accordingly, the light shielding layer LS is electrically connected to the first source electrode SE1 to apply a voltage to the light shielding layer LS and the driving of the first transistor TR1 may not be affected. However, in the present specification, even though it has been described that both the first active layer ACT1 and the first source electrode SE1 are in contact with the light shielding layer LS, only any one of the first source electrode SE1 and the first active layer ACT1 may be in direct contact with the light shielding layer. It is not limited thereto.

First, in each of the plurality of sub pixels SP, the first capacitor electrode SC1 is disposed between the insulating layer IN and the buffer layer 111. The first capacitor electrode SC1 may be disposed to be the closest to the substrate 710 among the conductive components disposed on the substrate 710. The first capacitor electrode SC1 may be integrally formed with the light shielding layer LS and be electrically connected to the first source electrode SE1 by means of the light shielding layer LS.

The buffer layer 111 is disposed on the first capacitor electrode SC1 and the second capacitor electrode SC2 is disposed on the buffer layer 111. The second capacitor electrode SC2 may be disposed so as to overlap with the first capacitor electrode SC1. The second capacitor electrode SC2 is integrally formed with the second source electrode SE2 to be electrically connected to the second source electrode SE2 and the first gate electrode GE1. For example, the semiconductor material is formed on the buffer layer 111 and a part of the semiconductor material is conducted to form the second source electrode SE2 and the second capacitor electrode SC2. Accordingly, a part of the semiconductor material which is not conducted functions as a second active layer ACT2 and the conducted part functions as a second source electrode SE2 and the second capacitor electrode SC2. As described above, the first gate electrode GE1 is electrically connected to the second source electrode SE2 through the contact hole formed in the gate insulating layer 112. Accordingly, the second capacitor electrode SC2 is integrally formed with the second source electrode SE2 to be electrically connected to the second source electrode SE2 and the first gate electrode GE1.

In summary, the first capacitor electrode SC1 of the storage capacitor SC is integrally formed with the light shielding layer LS to be electrically connected to the light shielding layer LS, the first source electrode SE1, and the third source electrode SE3. Accordingly, the second capacitor electrode SC2 is integrally formed with the second source electrode SE2 and the active layer ACT2 to be electrically connected to the second source electrode SE2 and the first gate electrode GE1. Accordingly, the first capacitor electrode SC1 and the second capacitor electrode SC2 which overlap with the buffer layer 111 therebetween constantly maintain the voltage of the first gate electrode GE1 and the first source electrode SE1 of the first transistor TR1 to maintain the constant state of the light emitting diode OLED.

Referring to FIGS. 7A to 7C, and 8, the plurality of holes H3 may be disposed in the substrate 710 so as to correspond to an area excluding an area of a channel region in which the plurality of active layers ACT1, ACT2, and ACT3 overlap with the gate electrodes GE1, GE2, and GE3 overlapping with the light shielding layer LS. The light shielding layer LS is electrically connected to the first source electrode SE1 or the first active layer ACT1 and is electrically connected to the third source electrode SE3 or the third active layer ACT3. Therefore, the first active layer ACT1 or the third active layer ACT3 overlapping with the light shielding layer LS is not affected by the parasitic capacitance. Accordingly, in the display device 700 according to still another exemplary aspect of the present disclosure, the plurality of holes H3 may be disposed in the substrate 710 to correspond to each of a channel region in which the second active layer ACT2 and the second gate electrode GE2 overlap with and a channel region in which the third active layer ACT3 and the third gate electrode GE3 overlap with as a channel region which does not overlap with the light shielding layer LS among the areas in which the active layers ACT1, ACT2, and ACT3 are disposed. However, this is just an example and the placement of the hole H3 may vary depending on a placement shape of the light shielding layer LS.

When a voltage is applied to the plurality of gate electrodes GE1, GE2, and GE3, a channel region in which electrons or holes move between the source electrodes SE1, SE2, and SE3 and the drain electrodes DE1, DE2, and DE3 is formed in the plurality of active layers ACT1, ACT2, and ACT3. If the plurality of holes H1 is not disposed in the substrate, a parasitic capacitance is generated between the substrate 710 which does not overlap with the light shielding layer LS and is formed of a transparent conductive oxide or an oxide semiconductor and a plurality of floating active layers ACT1, ACT2, and ACT3. Therefore, the movement of the electrons or holes in the channel region may be interrupted. Accordingly, in order to suppress the generation of the parasitic capacitance, the plurality of holes H3 may be formed in the substrate 710 so as to overlap with the channel region which does not overlap with the light shielding layer LS.

In the meantime, even though it is not illustrated in the drawings, the hole H3 may be formed in the substrate 710 to correspond to the entire area which does not overlap with the light shielding layer LS, among the area in which the active areas ACT1, ACT2, and ACT3 are disposed.

In the display device 700 according to still another exemplary aspect of the present disclosure, the substrate 710 is formed of one of a transparent conductive oxide or an oxide semiconductor and the plurality of holes H3 is disposed in the substrate 710 so as to correspond to the channel region which does not overlap with the light shielding layer LS. By doing this, the parasitic capacitance formed between the substrate 710 and the active layers ACT1, ACT2, and ACT3 may be minimized. Further, the problem in that the mobility of the electrons or holes of the channel region is lowered when the substrate 110 formed of a transparent conductive oxide or an oxide semiconductor overlap with the active layers ACT1, ACT2, and ACT3 of the plurality of thin film transistors TR1, TR2, and TR3 is suppressed. Furthermore, the reliability of the display device 100 may be improved. Accordingly, in the display device 700 according to an exemplary aspect of the present disclosure, the active layers ACT1, ACT2, and ACT3 overlap with the light shielding layer LS or the plurality of holes H3 so that the substrate 710 may be formed as a very thin film and the reliability of the thin film transistors TR1, TR2, and TR3 may be improved.

Figure 9:
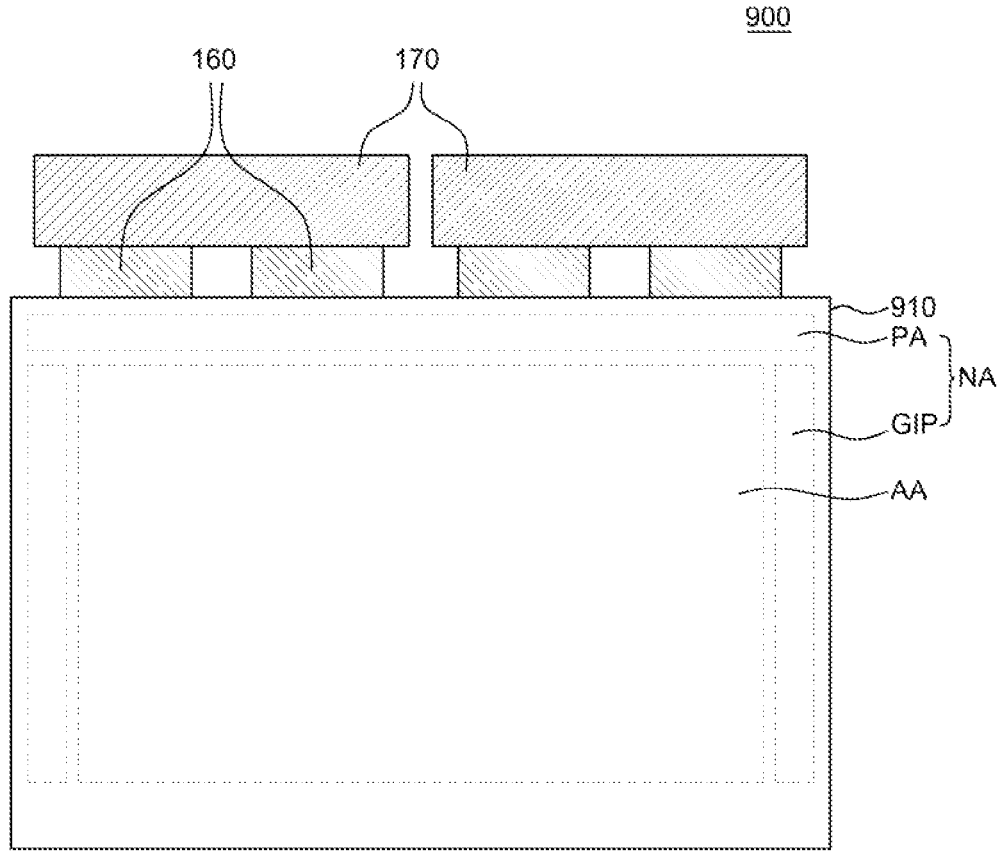
FIG. 9 is a plan view of a display device according to still another exemplary aspect of the present disclosure.

FIG. 9 is a plan view of a display device according to still another exemplary aspect of the present disclosure. In the display device 900 of FIG. 9, a configuration of an active area AA excluding a substrate 910 of a non-active area NA including a gate in panel area GIP and a pad area PA is substantially the same as the display device 100 of FIGS. 1 to 5 so that a redundant description is omitted.

The non-active area NA includes a pad area PA. The pad area PA may include a plurality of pads and signal lines which are connected to the plurality of pads. In the pad area PA, a driving IC, a driving circuit, or a flexible film 160 may be connected through the plurality of pads. The driving IC, the driving circuit, or the flexible film may transmit various driving signals, a low potential voltage, and a high potential voltage to the plurality of pads. The plurality of pads receives various driving signals for driving the display device 900 to supply the driving signals to the components of the display device 900 such as a plurality of sub pixels SP to drive the display device 900. The plurality of holes may not be disposed in the substrate which is disposed in the pad area PA and is formed of a transparent conductive oxide or an oxide semiconductor.

The non-active area NA includes a gate in panel area GIP in which the gate driver is disposed. For example, the gate in panel area GIP may be a non-active area at a left side and a right side of the active area AA, but is not limited thereto. The gate driver disposed in the gate in panel area GIP outputs a gate voltage and an emission control voltage under the control of a timing controller to select a sub pixel SP to which the data voltage is charged and control an emission timing.

The gate driver may have a complex circuit structure which is formed of various elements so as to sequentially output a gate voltage to the plurality of gate lines GL. In the meantime, the substrate 910 is formed of a transparent conductive oxide so that when the gate driver is driven, the polarization is generated to interrupt the driving of the gate driver. Therefore, the plurality of holes may be disposed in the substrate 910 to correspond to an area overlapping with the active layer of the plurality of thin film transistors disposed in the gate driver. However, when the light shielding layer LS is disposed in the gate driver, the plurality of holes may be formed so as to correspond to only an area in which the active layer and the light shielding layer LS do not overlap with, but is not limited thereto.

In the display device 900 according to still another exemplary aspect of the present disclosure, the substrate 910 is formed of one of a transparent conductive oxide or an oxide semiconductor. However, in the pad area PA, the plurality of holes is not disposed in the substrate but the plurality of holes may be disposed in the substrate 910 so as to correspond to the active layer which does not overlap with the light shielding layer LS in the gate in panel GIP in which the gate driver is disposed. The plurality of holes is disposed in the substrate 910 of the gate in panel area GIP to minimize the generation of the parasitic capacitance which interrupts the driving of the gate driver. Further, the problem in that the mobility of the electrons or holes of the channel region is lowered when the substrate 910 formed of a transparent conductive oxide or an oxide semiconductor overlap with the active layers of the plurality of thin film transistors is suppressed. Furthermore, the reliability of the display device 900 is improved.

Figure 10:
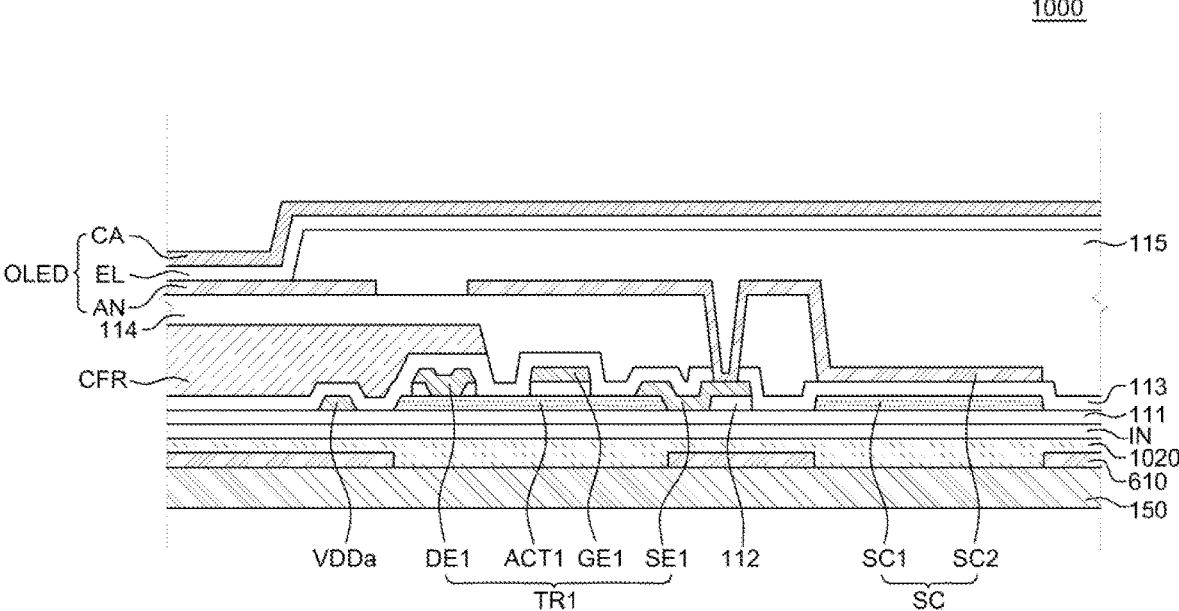
FIG. 10 is a schematic cross-sectional view of a display device according to still another exemplary aspect of the present disclosure.

FIG. 10 is a schematic cross-sectional view of a display device according to still another exemplary aspect of the present disclosure. The only difference between a display device 1000 of FIG. 6 and the display device 600 of FIG. 6 is a substrate 1010 and an oxide semiconductor cover layer 1020, but other configuration is substantially the same, so that a redundant description will be omitted.

Referring to FIG. 10, the substrate 1010 is formed of a transparent conductive oxide. In the meantime, a plurality of holes is disposed in the substrate 1010 so as to correspond to an area overlapping with a first active layer ACT1, a second active layer ACT2, and a third active layer ACT3.

The oxide semiconductor cover layer 1020 is formed of a base unit 1021 disposed above the substrate 1010 and a plurality of protrusions 1022 which fills the plurality of holes of the substrate 1010. A shape of the plurality of holes disposed in the substrate 1010 is just an example, but it is not limited thereto.

The oxide semiconductor cover layer 1020 may be formed of an oxide semiconductor material formed of indium (In) and gallium (Ga), which is different from the substrate 1010, for example, a transparent oxide semiconductor such as indium gallium zinc oxide (IGZO), indium gallium oxide (IGO), and indium tin zinc oxide (ITZO). A thickness of the oxide semiconductor cover layer 1020 is 100 Å to 500 Å and in this range, it is advantageous to perform the laser lift off (LLO) process.

In the display device 1000, the substrate 1010 is formed of a transparent conductive oxide and the oxide semiconductor cover layer 1020 is formed above the substrate 1010 with an oxide semiconductor which is different from the substrate 1010 to perform the LLO process. When the display device 1000 is manufactured, a temporary substrate in which a sacrificial layer is formed is attached below the substrate 1010 and then a pixel unit 120 is formed on the oxide semiconductor cover layer 1020. After completing the manufacturing of the display device 1000, when a laser is irradiated from the lower portion of the temporary substrate, the hydrogen of the sacrificial layer is dehydrogenated, and the sacrificial layer and the temporary substrate may be separated from the substrate 1010. At this time, a transparent conductive oxide and an oxide semiconductor are materials which may perform the LLO process with the sacrificial layer and the temporary substrate. Therefore, the substrate 1010 and the oxide semiconductor cover layer 1020 may be easily separated from the temporary substrate. Accordingly, in the display device 1000 according to another exemplary aspect of the present disclosure, the substrate 1010 and the oxide semiconductor cover layer 1020 are configured by a transparent conductive oxide layer and an oxide semiconductor which may perform the LLO process, respectively. Therefore, the display device 1000 may be easily manufactured with the existing process and equipment.

In the display device 1000 according to still another exemplary aspect of the present disclosure, an oxide semiconductor cover layer 1020 including a plurality of protrusions 1022 which fills the plurality of holes disposed in the substrate 1010 and a base unit 1021 which covers an upper portion of the substrate 1010 is disposed on a front upper portion of the substrate 1010. Accordingly, during the LLO, the oxide semiconductor cover layer 1020 may assist to completely separate the substrate 1010 and the temporary substrate.

Figure 11:
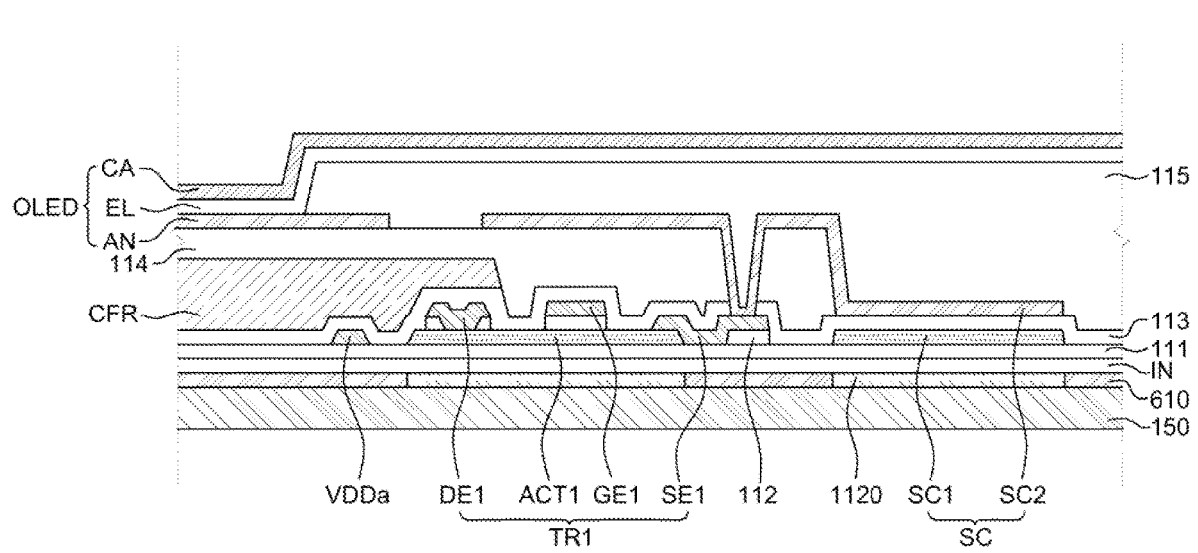
FIG. 11 is a schematic cross-sectional view of a display device according to still another exemplary aspect of the present disclosure.

FIG. 11 is a schematic cross-sectional view of a display device according to still another exemplary aspect of the present disclosure. The only difference between a display device 1100 of FIG. 11 and the display device 1000 of FIG. 10 is a plurality of oxide semiconductors 1120, but the other configuration is substantially the same, so that a redundant description will be omitted.

Referring to FIG. 11, the plurality of holes disposed in the substrate 1010 is filled with the plurality of oxide semiconductors 1120. A shape of the plurality of holes disposed in the substrate 1010 is just an example, but it is not limited thereto.

The plurality of oxide semiconductors 1120 may be formed of an oxide semiconductor material formed of indium (In) and gallium (Ga), which is different from the substrate 1010, for example, a transparent oxide semiconductor such as indium gallium zinc oxide (IGZO), indium gallium oxide (IGO), and indium tin zinc oxide (ITZO). A thickness of the plurality of oxide semiconductors 1120 is equal to the thickness of the substrate 1010.

At this time, the transparent conductive oxide and the oxide semiconductor are materials which may perform the LLO process with the sacrificial layer and the temporary substrate. Therefore, the substrate 1010 and the plurality of oxide semiconductors 1120 may be easily separated from the temporary substrate. Accordingly, in the display device 1100 according to another exemplary aspect of the present disclosure, the substrate 1010 and the plurality of oxide semiconductors 1120 are configured by one of a transparent conductive oxide layer and an oxide semiconductor which may perform the LLO process. Therefore, the display device 1100 may be easily manufactured with the existing process and equipment.

In the display device 1100 according to still another exemplary aspect of the present disclosure, the plurality of oxide semiconductors 1120 is disposed to completely separate the substrate 1010 and the temporary substrate during the LLO process to minimize the phenomenon that a part of the sacrificial layer or the temporary substrate remains below the substrate 1010 due to the plurality of holes.

The exemplary aspects of the present disclosure can also be described as follows:

According to an aspect of the present disclosure, there is provided a display device. The display device includes a substrate which includes an active area including a plurality of sub pixels and a non-active area, and is formed of one of transparent conductive oxide or an oxide semiconductor layer, an insulating layer on the substrate, a plurality of thin film transistors which is on the insulating layer and includes an active layer having a channel region, a gate electrode, a source electrode, and a drain electrode and a plurality of light emitting diodes disposed in the plurality of sub pixels on the insulating layer, wherein the substrate includes a plurality of holes which overlap with at least a part of the active layer.

The plurality of holes may overlap with the channel region of the active layer.

The plurality of holes may overlap with the entire active layer.

The display device may include a plurality of light shielding layers which may be disposed between the insulating layer and the plurality of thin film transistors, and may overlap with at least a part of the active layer, wherein the plurality of holes may overlap with the active layer which does not overlap with the plurality of light shielding layers.

The plurality of holes may overlap with the channel region of the active layer which does not overlap with the plurality of light shielding layers.

The plurality of thin film transistors may be disposed between the insulating layer and the plurality of light emitting diodes in the plurality of sub pixels.

The display device may include a gate driver may be disposed in the non-active area, wherein the plurality of thin film transistors may be disposed in the gate driver.

The non-active area may include a gate in panel region including the gate driver and a pad region in which the plurality of pads is disposed, the substrate overlap with the gate in panel region and the entire pad region, and in the non-active area, the plurality of holes may be disposed only in the gate in panel region.

The display device may further include a plurality of light shielding layers which overlap with at least a part of the active layer in the gate in panel region, wherein the plurality of holes overlap with the active layer which does not overlap with the plurality of light shielding layers.

The display device may further include a substrate including an active area and a non-active area at the outside of the active area, a plurality of thin film transistors including an active layer having a source region, a drain region, and a channel region on the substrate and an insulating layer disposed between the plurality of thin film transistors and the substrate, wherein the substrate is formed of one of a transparent conductive oxide and an oxide semiconductor including a plurality of holes overlapping with at least a part of the active layer.

The plurality of holes may overlap with the channel region.

The plurality of holes may overlap with the entire active layer.

The display device may include a plurality of light shielding layers which overlap with at least a part of the active layer between the substrate and the insulating layer, wherein the plurality of holes may overlap with the active layer which does not overlap with the plurality of light shielding layers.

The display device may include a gate driver may be disposed in the non-active area, wherein the active layer having the source region, the drain region, and the channel region is disposed in the gate driver.

The non-active area may include a gate in panel region including the gate driver and a pad region in which the plurality of pads may be disposed, the substrate overlap with the gate in panel region and the entire pad region, and in the non-active area, the plurality of holes may be disposed only in the gate in panel region.

The display device may include a plurality of light shielding layers which may overlap with at least a part of the active layer in the gate in panel region, wherein the plurality of holes may overlap with the active layer which does not overlap with the plurality of light shielding layers.

The display device may include an oxide semiconductor cover layer which may be disposed between the substrate and the insulating layer to cover the substrate, wherein the substrate may be formed of a transparent conductive oxide, and the oxide semiconductor cover layer may include a plurality of protrusions which fills the plurality of holes and a base unit disposed on the plurality of protrusions and the substrate.

The display device may include a plurality of oxide semiconductors which fills the plurality of holes, wherein the substrate may be formed of a transparent conductive oxide.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a substrate which includes an active area including a plurality of sub pixels and a non-active area, and is formed of transparent conductive oxide or an oxide semiconductor layer;
an insulating layer disposed on the substrate;
a plurality of thin film transistors disposed on the insulating layer and including an active layer having a channel region, a gate electrode, a source electrode, and a drain electrode; and
a plurality of light emitting diodes disposed in the plurality of sub pixels and disposed on the insulating layer,
wherein the substrate includes a plurality of holes, and
wherein at least some of the plurality of holes overlap an entire active layer of a respective one of the plurality of thin film transistors.

2. The display device according to claim 1, wherein the plurality of holes overlap with the channel region of the active layer.

3. The display device according to claim 1, further comprising a plurality of light shielding layers disposed between the insulating layer and the plurality of thin film transistors, and overlapping with at least a part of the active layer.

4. The display device according to claim 3, wherein the plurality of holes overlap with the active layer that does not overlap with the plurality of light shielding layers.

5. The display device according to claim 3, wherein the plurality of holes overlap with the channel region of the active layer that does not overlap with the plurality of light shielding layers.

6. The display device according to claim 1, wherein the plurality of thin film transistors is disposed between the insulating layer and the plurality of light emitting diodes in the plurality of sub pixels.

7. The display device according to claim 1, further comprising a gate driver disposed in the non-active area,
    wherein the plurality of thin film transistors is disposed in the gate driver.

8. The display device according to claim 7, wherein the non-active area includes a gate in panel region including the gate driver and a pad region in which the plurality of pads is disposed.

9. The display device according to claim 8, wherein the substrate overlap with the gate in panel region and the pad region, and the plurality of holes is disposed only in the gate in panel region in the non-active area.

10. The display device according to claim 8, further comprising a plurality of light shielding layers which overlap with at least a part of the active layer in the gate in panel region, wherein the plurality of holes overlap with the active layer which does not overlap with the plurality of light shielding layers.

11. A display device, comprising:
    a substrate including an active area and a non-active area disposed outside the active area;
    a plurality of thin film transistors including an active layer having a source region, a drain region, and a channel region disposed on the substrate; and
    an insulating layer disposed between the plurality of thin film transistors and the substrate,
    wherein the substrate is formed of transparent conductive oxide or oxide semiconductor and includes a plurality of holes, and
    wherein at least some of the plurality of holes overlap an entire active layer of a respective one of the plurality of thin film transistors.

12. The display device according to claim 11, wherein the plurality of holes overlap with the channel region.

13. The display device according to claim 11, wherein the plurality of holes overlap with the active layer.

14. The display device according to claim 11, further comprising a plurality of light shielding layers overlapping with at least a part of the active layer between the substrate and the insulating layer,
    wherein the plurality of holes overlap with the active layer that does not overlap with the plurality of light shielding layers.

15. The display device according to claim 11, further comprising a gate driver disposed in the non-active area,
    wherein the active layer having the source region, the drain region, and the channel region is disposed in the gate driver.

16. The display device according to claim 15, wherein the non-active area includes a gate in panel region including the gate driver and a pad region in which the plurality of pads is disposed, the substrate overlap with the gate in panel region and the pad region, and the plurality of holes 1s disposed only in the gate in panel region in the non-active area.

17. The display device according to claim 16, further comprising a plurality of light shielding layers which overlap with least a part of the active layer in the gate in panel region,
    wherein the plurality of holes overlap with the active layer that does not overlap with the plurality of light shielding layers.

18. The display device according to claim 1, further comprising an oxide semiconductor cover layer disposed between the substrate and the insulating layer to cover the substrate,
    wherein the substrate is formed of a transparent conductive oxide, and
    wherein the oxide semiconductor cover layer includes:
    a plurality of protrusions filling the plurality of holes; and
    a base unit disposed on the plurality of protrusions and the substrate.

19. The display device according to claim 1, further comprising a plurality of oxide semiconductors that fills the plurality of holes,
    wherein the substrate is formed of a transparent conductive oxide.

\* \* \* \* \*